United States Patent
Yamagata et al.

(10) Patent No.: US 8,420,191 B2
(45) Date of Patent: *Apr. 16, 2013

(54) SILICA CONTAINER AND METHOD FOR PRODUCING THE SAME

(75) Inventors: Shigeru Yamagata, Tokyo (JP); Tomomi Usui, Tokyo (JP)

(73) Assignee: Shin-Etsu Quartz Products Co., Ltd., Tokyo (JP)

( * ) Notice: Subject to any disclaimer, the term of this patent is extended or adjusted under 35 U.S.C. 154(b) by 116 days.

This patent is subject to a terminal disclaimer.

(21) Appl. No.: 13/054,909

(22) PCT Filed: Mar. 23, 2010

(86) PCT No.: PCT/JP2010/002026
§ 371 (c)(1),
(2), (4) Date: Jan. 19, 2011

(87) PCT Pub. No.: WO2010/125739
PCT Pub. Date: Nov. 4, 2010

(65) Prior Publication Data
US 2011/0143063 A1 Jun. 16, 2011

(30) Foreign Application Priority Data

Apr. 28, 2009 (JP) ................................. 2009-109262

(51) Int. Cl.
*B32B 1/02* (2006.01)
*C03C 17/02* (2006.01)

(52) U.S. Cl.
USPC .................. 428/34.6; 428/34.1; 428/34.4

(58) Field of Classification Search ................. 428/34.1, 428/34.4, 34.5, 34.6, 34.7, 35.7, 36.5, 36.6, 428/36.7, 36.9, 36.91
See application file for complete search history.

(56) References Cited

U.S. PATENT DOCUMENTS 4,935,046 A 6/1990 Uchikawa et al.
5,174,801 A 12/1992 Matsumura et al.
(Continued)

FOREIGN PATENT DOCUMENTS

JP A 1-197381 8/1989
JP B2 4-22861 4/1992
(Continued)

OTHER PUBLICATIONS

Dodd et al., "Optical Determinations of OH in Fused Silica," J. Appl. Phys. vol. 37, 1966, p. 3911.
(Continued)

*Primary Examiner* — Walter B Aughenbaugh
(74) *Attorney, Agent, or Firm* — Oliff & Berridge, PLC

(57) ABSTRACT

A method for producing a silica container that includes forming a powder mixture by adding an Al compound or a crystal nucleating agent into a first powdered raw material (silica particles), preliminarily molding to an intended shape by feeding the powder mixture to an inner wall of an outer frame while rotating the outer frame having aspiration holes, forming a silica substrate, wherein the preliminarily molded article is degassed by aspiration from a peripheral side and at the same time heated from inside the preliminarily molded article at high temperature thereby making a peripheral part of the preliminarily molded article to a sintered body while an inner part to a fused glass body, and forming a transparent silica glass layer on an inner surface of the silica substrate, wherein a second powdered raw material having a higher silica purity than the first powdered raw material is spread from inside the silica substrate and at the same time heated from the inside at high temperature.

8 Claims, 7 Drawing Sheets

U.S. PATENT DOCUMENTS

| | | | |
|---|---|---|---|
| 5,976,247 | A | 11/1999 | Hansen et al. |
| 6,660,671 | B2 | 12/2003 | Werdecker et al. |
| 2003/0012898 | A1 | 1/2003 | Kemmochi et al. |
| 2003/0029195 | A1* | 2/2003 | Watanabe .................. 65/17.4 |

FOREIGN PATENT DOCUMENTS

| | | |
|---|---|---|
| JP | A 5-105577 | 4/1993 |
| JP | B2 7-29871 | 4/1995 |
| JP | A 7-206451 | 8/1995 |
| JP | A 7-277743 | 10/1995 |
| JP | A 7-277744 | 10/1995 |
| JP | B2 3046545 | 3/2000 |
| JP | B2 3100836 | 8/2000 |
| JP | A 2002-362932 | 12/2002 |
| JP | A 2003-095678 | 4/2003 |
| JP | A 2004-131380 | 4/2004 |

OTHER PUBLICATIONS

Nasu at al., "Gas release of various kinds of vitreous silica," Journal of Illuminating Engineering Institute of Japan, vol. 74, No. 9, pp. 595-600, 1990.

Khotimchenko at al., "Determining the Content of Hydrogen Dissolved in Quartz Glass Using the Methods of Raman Scattering and Mass Spectrometry," Journal of Applied Spectroscopy, vol. 46, No. 6, pp. 632-635, 1987.

International Search Report issued in PCT/JP2010/002026, mailed May 25, 2010. (with English-language translation).

* cited by examiner (a)

SILICA CONTAINER AND METHOD FOR PRODUCING THE SAME

TECHNICAL FIELD

The present invention relates to a silica container mainly comprised of a silica and to a method for producing it, and in particular, relates to a silica container with a low cost, a high dimensional precision, and a high durability and to a method for producing it.

BACKGROUND ART

A silica glass is used for a lens, a prism and a photomask of a photolithography instrument in manufacturing of a large-scale integrated circuit (LSI), for a TFT substrate used for display, for a tube of a ultraviolet lamp or an infrared lamp, for a window material, for a reflection plate, for a cleaning container in a semiconductor industry, for a container for melting of a silicon semiconductor, and so forth. However, an expensive compound such as silicon tetrachloride must be used as a raw material for a silica glass used in these silica articles; on top of that, melting temperature and processing temperature of a silica glass is extraordinary high (about 2000° C.) thereby leading to a high energy consumption, and this in turn to causing enormous emission of carbon dioxide, which is considered to be one of the global warming gases. Accordingly, from the past, a method for producing a silica glass at relatively low temperature by using a relatively cheap raw material has been sought.

For example, in Patent Document 1, a method (sol-gel method) in which a silicon alkoxide is hydrolyzed to a silica sol, which is then gelated to a wet gel, then to a dry gel by drying, and finally to a transparent silica glass body by firing at high temperature is disclosed. In Patent Document 2, a method in which a transparent silica glass is obtained by a sol-gel method from a silica sol mixture solution formed of tetramethoxy silane or tetraethoxy silane and a silica sol solution containing silica fine particles is disclosed. In Patent Document 3, a method for producing a transparent silica glass by using a silicon alkoxide and silica glass fine particles as its main raw materials, wherein a heating process at the temperature range of 200 to 1300° C. is carried out under an oxygen gas-containing atmosphere, a further heating process to 1700° C. or higher is carried out under a hydrogen gas-containing atmosphere, and a heating process between the foregoing two heating processes is carried out under a reduced pressure atmosphere, is disclosed. In these sol-gel methods, however, not only there were problems in a dimensional precision and a durability of the produced silica glass but also production cost thereof was not so cheap.

In Patent Document 4, a method (slip casting method), wherein at least two different kinds of silica glass particles, for example, silica glass fine particles and silica glass granules are mixed to obtain a water-containing suspension solution, which is then press molded and sintered at high temperature to obtain a silica-containing composite body, is disclosed. In Patent Document 5, a method, wherein a mixed solution (slip) containing silica glass particles having the size of 100 μm or less and silica glass granules having the size of 100 μm or more is prepared, then the slip is cast into a molding frame, dried, and then sintered to obtain an opaque silica glass composite material, is disclosed. In these conventional slip casting methods, however, shrinkage of a molded article in drying and sintering processes is so large that a thick silica glass article with a high dimensional precision could not be obtained.

Accordingly, there are problems as mentioned above in the method for producing a silica glass article from a powdered raw material. Therefore, as a method for producing a silica crucible for manufacturing of a single crystal silicon used for LSI, methods disclosed in Patent Document 6 and Patent Document 7 are being used still today. In these methods, after a powdered natural quartz or a powdered synthetic cristobalite, which are ultra highly purified, is fed into a rotating mold made of carbon and then molded, carbon electrodes are inserted from the top and then electrically charged to cause arc discharge thereby raising the atmospheric temperature to a temperature range for melting of the powdered quartz (estimated temperature in the range from about 1800 to about 2100° C.) so that the powdered raw quartz may be melted and sintered.

In these methods, however, there has been a problem of a high cost because a highly purified powdered quartz is used. In addition, when a silica crucible is produced by a conventional method for manufacturing of a silica glass article and then used for growing of a silicon single crystal, there has been a problem such that much of gaseous bubbles are incorporated into a grown silicon single crystal.

CITATION LIST

Patent Document

Patent Document 1: Japanese Patent Application Laid-Open Publication No. H07-206451
Patent Document 2: Japanese Patent Application Laid-Open Publication No. H07-277743
Patent Document 3: Japanese Patent Application Laid-Open Publication No. H07-277744
Patent Document 4: Japanese Patent Application Laid-Open Publication No. 2002-362932
Patent Document 5: Japanese Patent Application Laid-Open Publication No. 2004-131380
Patent Document 6: Japanese Examined Patent Application Publication No. H04-22861
Patent Document 7: Japanese Examined Patent Application Publication No. H07-29871

SUMMARY OF THE INVENTION

Technical Problem to be Solved by the Invention

The present invention is made in view of the problems as mentioned above, and has an object to provide a method for producing a silica container with a high dimensional precision, a high durability, and suppressed gas release, mainly comprised of a silica, by using a cheap and relatively low grade powdered silica as a main raw material with a reduced energy consumption and a low production cost, and to provide a silica container as mentioned above.

Solution to Problem

The present invention was made in order to solve the problems as mentioned above and relates to a method for producing a silica container, the method for producing a silica container comprised of a silica as its main component and having a rotational symmetry, including at least: a step of forming a powder mixture by adding at least any one of an Al compound and a powdered compound capable of becoming a crystal nucleating agent for crystallization of a silica glass, into a first powdered raw material, silica particles, a step of forming a preliminarily molded article, wherein the powder mixture is fed to an inner wall of an outer frame having a rotational symmetry and aspiration holes arranged splittingly in the inner wall while rotating the outer frame thereby preliminarily molding the powder mixture to an intended shape in accordance with the inner wall of the outer frame, a step of forming a silica substrate, wherein the preliminarily molded article is degassed by aspiration from a peripheral side through the aspiration holes formed in the outer frame and at the same time heated from inside the preliminarily molded article by a discharge-heat melting method at high temperature thereby making a peripheral part of the preliminarily molded article to a sintered body while an inner part to a fused glass body, and a step of forming a transparent silica glass layer on an inner surface of the silica substrate, wherein a second powdered raw material comprised of crystalline silica and having a higher silica purity than the first powdered raw material is spread from inside the silica substrate and at the same time heated from the inside by a discharge-heat melting method at high temperature.

If the method for producing a silica container includes the steps as mentioned above, gases (gas molecules) dissolved in a produced silica container can be suppressed. Because of this, gas molecules released from the silica container upon its use can be suppressed, thereby enabling to decrease a harmful effect caused by gas molecules to a material accommodated in the silica container. In addition, a silica container, having a high dimensional precision and a high durability, capable of fully avoiding impurity contamination to a material accommodated therein can be produced with a low energy consumption, a high productivity, and a low cost.

In this case, it is preferable that an atmospheric gas in the step of forming the silica substrate from the preliminarily molded article be made to a gas mixture comprised of an inert gas as its main component and 1% or more by volume of an $H_2$ gas.

If the atmospheric gas in the step of forming the silica substrate from the preliminarily molded article is made to a gas mixture comprised of an inert gas as its main component and 1% or more by volume of a hydrogen gas, among the gases dissolved in the produced silica substrate, in particular, amounts of an $H_2O$ molecule and an $O_2$ molecule dissolved in the silica substrate can be reduced effectively.

In the method for producing a silica container of the present invention, the atmospheric gas in the step of forming the transparent silica glass layer can be made to a gas mixture comprised of an inert gas as its main component and an $O_2$ gas in the range from 1 to 25% by volume.

When the atmospheric gas in the step of forming the transparent silica glass layer is made to a gas mixture comprised of an inert gas as its main component and an $O_2$ gas in the range from 1 to 25% by volume, the transparent silica glass layer containing small amount of fine particles of carbon (C) can be obtained.

In addition, in the method for producing a silica container of the present invention, the atmospheric gas in the step of forming the transparent silica glass layer can be made to a gas mixture comprised of an inert gas as its main component and an $H_2$ gas in the range from 1 to 10% by volume.

When the atmospheric gas in the step of forming the transparent silica glass layer is made to a gas mixture comprised of an inert gas as its main component and an $H_2$ gas in the range from 1 to 10% by volume, among the gases dissolved in the produced silica container, in particular, amounts of an $H_2O$ molecule and an $O_2$ molecule dissolved in the transparent silica glass layer can be reduced effectively.

In the method for producing a silica container of the present invention, a silica purity of the first powdered raw material can be made in the range from 99.9 to 99.999% by weight.

In the method for producing a silica container of the present invention, even if a silica purity of the first powdered raw material is made relatively low, in the range from 99.9 to 99.999% by weight, impurity contamination to a material accommodated therein can be fully avoided. Accordingly, the powdered raw material can be prepared very cheaply.

It is preferable that the method have a step of adding at least one element of Ca, Sr, and Ba into the second powdered raw material with the total element concentration of Ca, Sr, and Ba contained therein being in the range from 50 to 5000 ppm by weight.

In addition, it is preferable that the method further have a step of forming a coating layer containing at least one element of Ca, Sr, and Ba on an inner surface side of the transparent silica glass layer with the total element concentration of Ca, Sr, and Ba contained in the coating layer being in the range from 5 to 500 µg/cm².

When at least any one of a step of adding at least one element of Ca, Sr, and Ba into the second powdered raw material with the total element concentration being in the range from 50 to 5000 ppm by weight and a step of forming a coating layer containing at least one element of Ca, Sr, and Ba on an inner surface side of the transparent silica glass layer with the total element concentration of Ca, Sr, and Ba being in the range from 5 to 500 µg/cm² is executed, the transparent silica glass layer is recrystallized upon use of the obtained silica container at such high temperature as in the range from 1300 to 1600° C., thereby enabling to further reduce impurity contamination to a material accommodated therein and at the same time enabling to suppress etching and dissolution of surface of the transparent silica glass layer.

In addition, according to the method for producing a silica container in the present invention, it is possible to use the silica container as a crucible for pulling up of a silicon single crystal.

Accordingly, the silica container produced by the method for producing a silica container in the present invention can be used suitably as a crucible for pulling up of a silicon single crystal. As a result, a total energy consumption and a total cost for production of a silicon single crystal can be reduced. Further, because gaseous molecules dissolved in the produced silica container can be suppressed, release of the gaseous molecules from the silica container can be suppressed so that a harmful effect by the gaseous molecules to a silicon single crystal to be pulled up can be reduced.

Further, the present invention provides a silica container comprised of: a silica substrate having a rotational symmetry and a white opaque layer containing gaseous bubbles at least in its peripheral part, and a colorless transparent silica glass layer, not substantially containing gaseous bubbles, formed on an inner wall of the silica substrate, wherein the silica substrate contains an OH group in the concentration range from 10 to 1000 ppm by weight and at least any one of Al and a compound capable of becoming a crystal nucleating agent for crystallization of a silica glass with the total amount of them being in the range from 10 to 1000 ppm by weight, while the total element concentration of Li, Na, and K is 100 or less ppm by weight, and amount of an $H_2O$ molecule released upon heating at 1000° C. under vacuum is $3 \times 10^{17}$ or less molecules/cm³, and, the transparent silica glass layer contains an OH group in the concentration range from 1 to 200 ppm by weight with each element concentration of Li, Na, and K being 60 or less ppb by weight, and each element concentration of Ti, V, Cr, Mn, Fe, Co, Ni, Cu, Zn, Zr, Mo, Ta, and W being 30 or less ppb by weight.

According to the silica container like this, it is possible to make the silica container cheap, fully capable of avoiding impurity contamination to a material accommodated therein, and have a high dimensional precision and a high durability, in spite of the low cost silica container. In addition, at the same time because $H_2O$ molecules dissolved in the silica substrate is suppressed, release of $H_2O$ is also suppressed so that a harmful effect by an $H_2O$ molecule to a material accommodated in the silica container can be reduced.

In this case, it is preferable that the crystal nucleating agent be any one or more of CaO, MgO, BeO, $ZrO_2$, $HfO_2$, $Al_2O_3$, $ZrB_2$, $HfB_2$, $TiB_2$, $LaB_6$, ZrC, HfC, TiC, TaC, ZrN, HfN, TiN, and TaN.

Accordingly, when the crystal nucleating agent is one or more of the compounds as mentioned above, the prevention effect of impurity diffusion can be given to the silica substrate more effectively so that impurity contamination to a material accommodated therein can be reduced even further.

In addition, it is preferable that the silica substrate contain an OH group in the concentration range from 30 to 300 ppm by weight, Al in the concentration range from 30 to 300 ppm by weight, and the crystal nucleating agent in the concentration range from 30 to 300 ppm by weight.

Accordingly, when the silica substrate contains an OH group, Al, and the crystal nucleating agent in each of the foregoing concentration ranges simultaneously, impurity contamination to a material accommodated therein can be reduced even further.

In addition, the silica substrate is preferably the one that releases the gases upon heating at 1000° C. under vacuum in the amount of $1\times10^{15}$ or less molecules/cm² for an $O_2$ molecule, $5\times10^{16}$ or less molecules/cm³ for an $H_2O$ molecule, $5\times10^{16}$ or less molecules/cm³ for an $H_2$ molecule, $5\times10^{16}$ or less molecules/cm³ for a CO molecule, and $1\times10^{16}$ or less molecules/cm³ for a $CO_2$ molecule.

When amounts of the released gases upon heating of the silica substrate at 1000° C. under vacuum are as mentioned above, each gas molecule dissolved in the silica substrate is suppressed so that a harmful effect by each gas molecule to a material accommodated in the silica container can be reduced even further.

In addition, it is preferable that the transparent silica glass layer contain an OH group in the concentration range from 30 to 100 ppm by weight with each element concentration of Li, Na, and K being 20 or less ppb by weight and each element concentration of Ti V, Cr, Mn, Fe, Co, Ni, Cu, Zn, Zr, Mo, Ta, and W being 10 or less ppb by weight.

Accordingly, when the transparent silica glass layer contains an OH group in the range from 30 to 100 ppm by weight, diffusion of impure metal elements can be suppressed more effectively so that a harmful effect by impure metal elements to a material accommodated in the silica container can be reduced more effectively. Further, when concentration of each element in the transparent silica glass layer, i.e., Li, Na, K, Ti, V, Cr, Mn, Fe, Co, Ni, Cu, Zr, Mo, Ta, and W, is a value as described above, a harmful effect by impure metal elements to a material accommodated in the silica container can be reduced even further.

In addition, the transparent silica glass layer is preferably the one that releases the gases upon heating at 1000° C. under vacuum in the amount of $1\times10^{15}$ or less molecules/cm² for an $O_2$ molecule, $3\times10^{17}$ or less molecules/cm³ for an $H_2O$ molecule, $5\times10^{16}$ or less molecules/cm³ for an $H_2$ molecule, $5\times10^{16}$ or less molecules/cm³ for a CO molecule, and $1\times10^{16}$ or less molecules/cm³ for a $CO_2$ molecule.

When amounts of the released gases upon heating of the transparent silica glass layer at 1000° C. under vacuum are as mentioned above, each gas molecule dissolved in the transparent silica glass layer is suppressed so that a harmful effect by each gas molecule to a material accommodated in the silica container can be reduced even further.

In addition, it is preferable that the transparent silica glass layer contain at least one element of Ca, Sr, and Ba with the total element concentration of Ca, Sr, and Ba being in the range from 50 to 5000 ppm by weight.

Further, it is preferable that the transparent silica glass layer have further a coating layer, on an inner surface side of the transparent silica glass layer, containing at least one element of Ca, Sr, and Ba with the total element concentration of Ca, Sr, and Ba contained in the coating layer being in the range from 5 to 500 µg/cm².

Accordingly, when the transparent silica glass layer is made to satisfy at least any one of the following: the transparent silica glass layer contains at least one element of Ca, Sr, and Ba with the total element concentration being 50 to 5000 ppm by weight, and the coating layer containing at least one element of Ca, Sr, and Ba with the total element concentration being in the range from 5 to 500 µg/cm² is formed on an inner surface side of the transparent silica glass layer, the transparent silica glass layer is recrystallized at the time of using the silica container at such high temperature as in the range from 1300 to 1600° C., resulting in not only enabling to further reduce impurity contamination to a material accommodated therein but also enabling to suppress etching and dissolution of surface of the transparent silica glass layer.

Advantageous Effects of the Invention

As described above, according to the method for producing a silica container in the present invention, gas molecules dissolved in the produced silica container can be suppressed. Therefore, gas molecules released from the silica container upon its use can be suppressed; thus a harmful effect by the gas molecules to a material accommodated in the silica container can be reduced. With this, a silica container, having a high dimensional precision and a high durability, capable of fully avoiding impurity contamination to a material accommodated therein can be produced with a low energy consumption, a high productivity, and a low cost.

In addition, according to the silica container of the present invention, a cheap silica container, having a high dimensional precision and a high durability, capable of fully avoiding impurity contamination to a material accommodated therein can be produced in spite of the low cost silica container. With this, in addition, because gas molecules including an $H_2O$ molecule dissolved in the silica substrate is suppressed, release of these gas molecules is also suppressed; and thus a harmful effect by these gas molecules to a material accommodated in the silica container can be reduced.

BEST MODES FOR CARRYING OUT THE INVENTION

Figure 1:
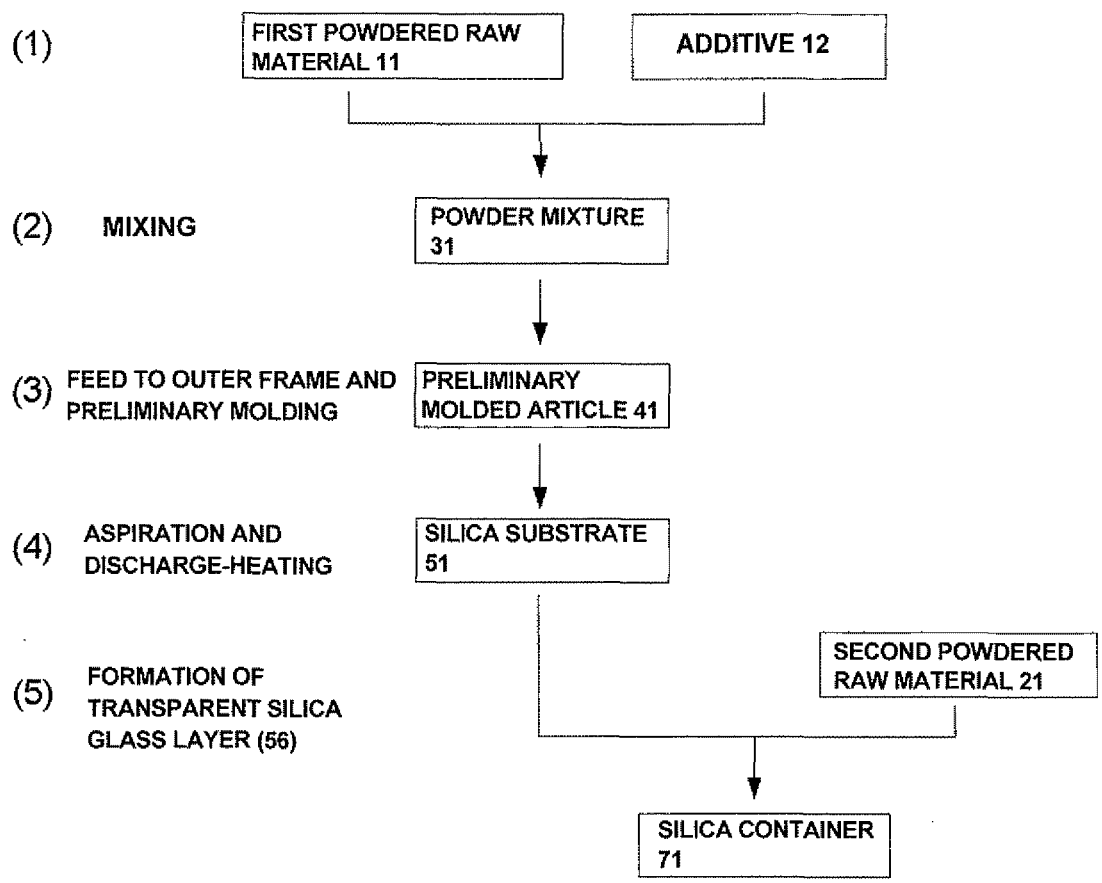
FIG. 1 is a flow chart showing outline of the method for producing a silica container in the present invention.

As mentioned above, in a conventional method for producing the silica container, there have been such problems as a large energy consumption due to high temperature for processing and heat-treatment, and an extraordinary large emission of carbon dioxide. In addition, the method has a problem of a high production cost because ultra-pure powdered quartz is used as a raw material for the entire container.

Further, as mentioned above, in the silica container obtained by a conventional method for producing a silica container, there has been a problem of the gas effect to a material accommodated therein, such as incorporation of gaseous bubbles into a silicon single crystal in a crucible for growing of a silicon single crystal.

The inventors of the present invention carried out investigation in view of the problems like these and found the following problems to be solved.

The first problem is to make the silica container have reduced amounts of dissolved gases (i.e., low gas release), such as an $O_2$ gas (an oxygen molecule), an $H_2$ gas (a hydrogen molecule), an $H_2O$ gas (a water molecule), a CO gas (a carbon monoxide molecule), and a $CO_2$ gas (a carbon dioxide molecule).

This is because, if such gases as an $O_2$ gas (oxygen molecule), an $H_2$ gas (hydrogen molecule), an $H_2O$ gas (water molecule), a CO gas (carbon monoxide molecule), and a $CO_2$ gas (carbon dioxide molecule) are incorporated in the silica container, in the case of the silica container used to pull up a silicon single crystal, these gases are released into a silicon melt at the time of silicon crystal production; these gases are then incorporated into a growing silicon single crystal as gaseous bubbles. When the silicon single crystal thus formed is used as a wafer, these incorporated gases form a void and a pinhole thereby resulting in an exceedingly decreased production yield. Accordingly, reduction of release of gas molecules from the silica container was considered to be the first problem.

Among the foregoing gases, dissolved amount of an $H_2O$ gas was particularly large in the past; and thus reduction of amount of this dissolved $H_2O$ gas was considered to be the central problem to be solved in particular.

A silica container such as a crucible and a boat for melting of metal silicon and for production of a silicon single crystal requires thermal uniformity inside the container under atmosphere of high temperature heating. Because of this, the second problem is to make at least the silica container a multi-layer structure, wherein an outer part of the container is made to a porous white opaque silica glass while an inner part of the container is made to a colorless transparent silica glass with substantially little gaseous bubbles.

Particularly for a silica container such as a crucible and a boat for production of a silicon single crystal, a large silica container is required as the silicon crystal progresses toward a larger diameter; and thus the third problem is to prevent softening and deformation of the silica container itself at high temperature for melting of a metal silicon (for example about 1400 to about 1600° C.) from occurring.

If a metal element contained as the impurity in the silica container, for example, not only an alkaline metal such as Li (lithium), Na (sodium), and K (potassium), but also, in particular, Ti (titanium), V (vanadium), Cr (chromium), Mn (manganese), Fe (iron), Co (cobalt), Ni (nickel), Cu (copper), Zn (zinc), Zr (zirconium), Mo (molybdenum), Ta (tantalum), and W (tungsten) is incorporated into a silicon crystal at the time of silicon crystal production, it leads, for example, to decrease in the incident photon-to-current conversion efficiency in a silicon device for solar use (for solar photovoltaic power generation). Accordingly, the fourth problem is to provide the silica container having an effect to adsorb and immobilize impurities and an effect to shield impurities (diffusion-prevention) so that impurities contained in the silica container may not diffuse into a silicon melt.

If a component of a silica container itself is dissolved into a silicon melt at the time of silicon crystal production thereby causing incorporation of, in particular, an element of oxygen into the silicon crystal, there appears a problem such as, for example, causing decrease in the incident photon-to-current conversion efficiency in production of a silicon device for solar use. Accordingly, the fifth problem is to make a silica container have characteristics that the inside surface of the container does not dissolve easily to a silicon melt (i.e., having etching resistance properties).

As mentioned above, it was necessary to simultaneously solve these five technical problems in a low cost in the present invention. Accordingly, the sixth problem to be solved was to obtain a low cost production method by using a cheap silica raw material not requiring a treatment for ultrahigh purification.

Hereinafter, the present invention will be explained with referring to the figures, but the present invention is not limited to them. In particular in the following, a silica container (a solar-grade crucible) applicable as a container for melting of a metal silicon used as a material for a solar cell (a solar photovoltaic power generation, or a solar power generation) as well as a production method thereof will be explained mainly as one suitable example of application of the present invention; but the present invention is not limited to this and can be applied widely to a general silica container having a rotational symmetry mainly comprised of a silica.

In FIG. 2(c), a schematic cross section view of one example of the silica container of the present invention is shown.

The silica container 71 of the present invention has a rotational symmetry, and its basic structure is formed of two layers comprised of the silica substrate 51 in an outer layer and the transparent silica glass layer 56.

Meanwhile, as far as the container has at least these layers, the silica container of the present invention may contain a layer other than these layers.

The silica substrate 51 has at least a part comprised of a gaseous bubble-containing white opaque layer 51a (hereinafter also referred to as an opaque layer part) in its outer peripheral part. Alternatively, a part comprised of a transparent or a semitransparent layer 51b (hereinafter also referred to as a transparent layer part) may be arranged inside the white opaque layer part 51a. With this, thermal uniformity inside the silica container 71 can be increased under heating condition.

Purity of silica of the silica substrate 51 in the present invention can be made relatively low, in the range from 99.9 to 99.999% by weight. According to the silica container of the present invention, even if a silica container is made cheap with the silica substrate 51 having such a low purity, impurity contamination to a material accommodated therein can be fully avoided.

Further, the total element concentration of the alkaline metal elements Li, Na, and K in the silica substrate 51 is made 100 or less ppm by weight. It is preferable that each concentration of the alkaline metal elements Li, Na, and K be 10 or less ppm by weight.

At the same time, the silica substrate 51 contains an OH group in the concentration range from 10 to 1000 ppm by weight. In addition, the silica substrate 51 contains at least any one of Al and a compound capable of becoming a crystal nucleating agent for crystallization of a silica glass with the total amount of them being in the range from 10 to 1000 ppm by weight. With this, metal element impurities can be adsorbed and fixed.

Control of the OH concentration can be done by such methods as adjusting an OH group contained in a powdered raw material (i.e., a first powdered raw material 11) for forming the silica substrate 51 (this method will be mentioned later), and changing the conditions of atmosphere, temperature, and time in a step of melting and sintering in production of the silica container (this method will be mentioned later). By making the OH concentration in the range as described above, effect of adsorption and immobilization of metal element impurities can be improved.

When the upper limit of the OH concentration in the silica substrate is made 1000 ppm by weight, decrease of the silica glass viscosity at high temperature caused by increase in the OH concentration can be suppressed.

On top of that, effect of containing Al in the silica substrate 51 resides in that the silica glass viscosity at high temperature can be improved; and thus a resistance to thermal distortion of the silica container 71 at high temperature can be improved.

If the silica substrate 51 contains at least one of crystal nucleating agents (agents to form crystal nucleus) of powdered heat-resistant ceramics (powdered compound melting at high temperature of about 2000° C. or higher), for example, oxides such as CaO, MgO, BeO, $ZrO_2$, $HfO_2$, and $Al_2O_3$, borates such as $ZrB_2$, $HfB_2$, $TiB_2$, and $LaB_6$, carbides such as ZrC, HfC, TiC, and TaC, and nitrides such as ZrN, HfN, TiN, and TaN, fine crystals of a cristobalite, an opal, and the like are formed around the crystal nucleating agent as the crystal center thereby expressing the prevention effect of metal impurity diffusion, when the container is heat-treated in the temperature range from about 1400° C. to about 1600° C. before its use or the container is used in the temperature range from about 1400° C. to about 1600° C.

It is preferable that the silica substrate 51 contain an OH group in the concentration range from 30 to 300 ppm by weight, Al in the concentration range from 30 to 300 ppm by weight, and the crystal nucleating agent in the range from 30 to 300 ppm by weight. It is further preferable that these conditions be satisfied simultaneously.

Details of a mechanism for Al, the crystal nucleating agent, and an OH group to prevent migration and diffusion of metal element impurities in the silica glass from occurring are not known; but it is assumed that a positive ion (cation) of metal element impurities balances in its electric charge with a silica glass network by displacing Si with Al, resulting in adsorption as well as prevention of diffusion from occurring. The crystal nucleating agent is a compound that becomes a crystal nucleus of a cristobalite, an opal, and other silica minerals when the silica container is used at high temperature in the range from 1400 to 1600° C.; it is assumed that these fine crystals formed in the silica glass (that is, glass ceramics is formed) drastically decreases the diffusion coefficients of metal element impurities. Further, it is assumed that effect of adsorption or diffusion prevention of metal element impurities is expressed by displacing a hydrogen ion of the OH group with a metal ion.

The silica container 71 is used at high temperature and under reduced pressure in many cases; and thus it is necessary to reduce amount of gas release from the silica container 71 under such conditions. The silica substrate 51 needs to be the one that releases $3 \times 10^{17}$ or less molecules/cm$^3$ of an $H_2O$ molecule when heated at 1000° C. under vacuum.

In addition, it is more preferable that amount of released gases when heated at 1000° C. under vacuum be $1 \times 10^{15}$ or less molecules/cm$^2$ for an $O_2$ molecule, $5 \times 10^{16}$ or less molecules/cm$^3$ for an $H_2O$ molecule, $5 \times 10^{16}$ or less molecules/cm$^3$ for an $H_2$ molecule, $5 \times 10^{16}$ or less molecules/cm$^3$ for a CO molecule, and $1 \times 10^{16}$ or less molecules/cm$^3$ for a $CO_2$ molecule.

If each gas molecule dissolved in the silica substrate 51 is suppressed as mentioned above, a harmful effect by each gas molecule to a material accommodated in the silica container can be reduced. For example, when the silica container 71 of the present invention is used for pulling up of a silicon single crystal, a structural defect of gaseous bubbles, called a void or a pinhole, is brought about in the crystal if the foregoing gases are released whereby these gases are incorporated into the silicon crystal; however, according to the present invention, this harmful effect can be reduced.

On the other hand, the transparent silica glass layer 56, which is formed on an inner wall of the silica substrate 51 and is colorless and transparent with not containing gaseous bubbles substantially, contains an OH group in the concentration range from 1 to 200 ppm by weight, while each element concentration of Li, Na, and K is made to 60 or less ppb by weight and each element concentration of Ti, V, Cr, Mn, Fe, Co, Ni, Cu, Zn, Zr, Mo, Ta, and W is made to 30 or less ppb by weight.

It is preferable that the transparent silica glass layer 56 contain an OH group in the concentration range from 30 to 100 ppm by weight while each element concentration of Li, Na, and K be made to 20 or less ppb by weight and each element concentration of Ti, V, Cr, Mn, Fe, Co, Ni, Cu, Zn, Zr, Mo, Ta, and W be made to 10 or less ppb by weight.

Accordingly, when the transparent silica glass layer contains an OH group in the concentration range from 30 to 100 ppm by weight, diffusion of impure metal elements can be suppressed more effectively so that a harmful effect by impure metal elements to a material accommodated in the silica container can be reduced more effectively. Further, when concentration of each element in the transparent silica glass layer, i.e., Li, Na, K, Ti, V, Cr, Mn, Fe, Co, Ni, Cu, Zn, Zr, Mo, Ta, and W, is the value as described above, a harmful effect by impure metal elements to a material accommodated in the silica container can be reduced even further.

In addition, the transparent silica glass layer 56 is preferably the one that releases the gases upon heating at 1000° C. under vacuum in the amount of $1 \times 10^{15}$ or less molecules/cm$^2$ for an $O_2$ molecule, $3 \times 10^{17}$ or less molecules/cm$^3$ for an $H_2O$ molecule, $5 \times 10^{16}$ or less molecules/cm$^3$ for an $H_2$ molecule, $5 \times 10^{16}$ or less molecules/cm$^3$ for a CO molecule, and $1 \times 10^{16}$ or less molecules/cm$^3$ for a $CO_2$ molecule.

When each gas molecule dissolved in the transparent silica glass layer 56 is suppressed as mentioned above, a harmful effect by each gas molecule to a material accommodated in the silica container can be reduced even further.

When the silica container 71 of the present invention is used as a crucible for pulling up of a silicon single crystal thereby requiring high durability, such as, for example, a container for continuous pulling up (multipulling) of a silicon single crystal in manufacturing of a solar power generation device, it is preferable that at least one element of calcium (Ca), strontium (Sr), and barium (Ba), the element belonging to the group 2 (group IIA), be contained in the transparent silica glass layer 56 in order to reduce etching dissolution of the transparent silica glass layer 56 by the silicon melt of a material accommodated therein. In this case, it is preferable that the total element concentration of Ca, Sr, and Ba contained in the transparent silica glass layer 56 be in the range from 50 to 5000 ppm by weight. It is more preferable that the element belonging to the group 2 be Sr or Ba, while Ba is still more preferable because it is difficult to be incorporated into a silicon single crystal.

If at least one element of Ca, Sr, and Ba is contained in the transparent silica glass layer 56 as mentioned above, inner surface of the transparent silica glass layer 56, i.e., inner surface of the silica container, is recrystallized at the temperature of melting of silicon (about 1500° C.) thereby forming a cristobalite; and thus high etching resistance to the silicon melt can be obtained.

Alternatively, if a coating layer containing at least one element of Ca, Sr, and Ba is formed inside the transparent silica glass layer 56, a similar effect can be obtained. In this case, it is preferable that the total element concentration of Ca, Sr, and Ba contained in the coating layer be in the range from 5 to 500 μg/cm².

The crystallization facilitating agents as mentioned above are described in the literatures (Japanese Patent No. 3100836 and Japanese Patent No. 3046545).

When an $H_2O$ gas (an $H_2O$ molecule) and an $O_2$ gas (an $O_2$ molecule) contained in the transparent silica glass layer 56 is reduced, especially in the case that the silica container 71 is used as a crucible for pulling up of a silicon single crystal, release of water and oxygen upon melting of silicon can be reduced thereby enabling to reduce oxygen concentration and to reduce forming of crystal defects such as a void and a pinhole in the silicon crystal.

Specifically, it is preferable that concentration of an $H_2O$ molecule and an $O_2$ molecule contained in the transparent silica glass layer 56 be $3\times10^{17}$ or less molecules/cm³ for an $H_2O$ gas and $1\times10^{15}$ or less molecules/cm² for an $O_2$ gas (the amounts of released gases are measured by heating of a measuring sample, obtained from the transparent silica glass layer 56 by cutting, at 1000° C. under vacuum).

Hereinafter, a method for producing a silica container of the present invention, enabling to produce the silica container as mentioned above, will be explained more specifically. In particular, a method for producing a silica container (solar-grade crucible) with a low production cost, usable as a container for melting of a metal silicon (Si) used as a material of a solar power generation device and the like as well as for pulling up of a single crystal, will be explained as the example.

Schematic diagram of a method for producing the silica container 71 of the present invention is shown in FIG. 1.

Firstly, a first powdered raw material 11 (silica particles) and an additive 12 (at least any one of an Al compound and a powdered compound capable of becoming a crystal nucleating agent for crystallization of a silica glass) to be added to the first powdered raw material 11 are prepared, as shown in FIG. 1, (1) (Step 1).

The first powdered raw material 11 will become a main composition material of the silica substrate 51 in the silica container of the present invention.

The first powdered raw material can be obtained by crushing mass of silica and classifying the powders thereby obtained, for example, by the method as described below, though not limited to it.

Firstly, mass of natural silica (a naturally produced berg crystal, a quartz, a silica, a silica stone, an opal stone, and so forth) with diameter in the range from about 5 to about 50 mm is heated in the temperature ranging from 600 to 1000° C. for about 1 to about 10 hours under an air atmosphere. Then, the mass of natural silica thus treated is poured into water to be cooled down quickly, separated, and then dried. With these treatments, subsequent crushing by a crusher and classification treatment of the obtained powders can be executed easily; but crushing treatment may be executed without executing the foregoing heating and quick cooling treatments.

Then, the mass of the natural silica is crushed by a crusher or the like, and then classified to particles having diameter of preferably in the range from 0.01 to 5 mm, and more preferably in the range from 0.03 to 1 mm, to obtain a powdered natural silica.

Thereafter, the powdered natural silica thus obtained is heated at 700 to 1100° C. for about 1 hour to about 100 hours in a rotary kiln made of a silica glass tube having an inclination angle, inside of which is made to an atmosphere containing a hydrogen chloride gas (HCl) or a chlorine gas ($Cl_2$) for high-purification treatment. However, for the use not requiring a high purity, this high-purification treatment can be omitted to proceed to the subsequent steps.

The first powdered raw material 11 obtained after the foregoing steps is a crystalline silica; but depending on the use purpose of the silica container, an amorphous silica glass scrap may also be used as the first powdered raw material 11.

Diameter of the first powdered raw material 11 is preferably in the range from 0.01 to 5 mm, and more preferably in the range from 0.03 to 1 mm, as mentioned above.

Silica purity of the first powdered raw material 11 is preferably 99.9% or more by weight, and more preferably 99.99% or more by weight. According to the method for producing a silica container in the present invention, even if silica purity of the first powdered raw material 11 is made relatively low, i.e., 99.999% or less by weight, impurity contamination to a material accommodated in the produced silica container can be fully avoided. Accordingly, the silica container can be produced with a lower cost as compared with the conventional methods.

Then, as shown in FIG. 1, (2), an additive 12 (namely, at least any one of an Al compound and a powdered compound capable of becoming a crystal nucleating agent for crystallization of a silica glass) is added to the first powdered raw material 11 to obtain a powder mixture 31 (Step 2).

As mentioned above, because the first powdered raw material 11 is of relatively low purity, the first powdered raw material 11 is made to contain prescribed amount of an Al compound or a crystal nucleating agent to prevent migration and diffusion of an impure metal element into the transparent silica glass layer 56 from the silica substrate 51 of the silica container 71. Al is added, for example, as an aqueous or alcoholic solution of an Al salt of nitrate, acetate, carbonate, chloride, or the like; a powdered silica is added into such a solution, soaked with it, and then dried to obtain the powder mixture. As the crystal nucleating agent, a finely powdered compound having a melting point of 2000° C. or higher can be used; candidate examples of the agent include an oxide such as CaO, MgO, BeO, $ZrO_2$, $HfO_2$, and $Al_2O_3$, a borate such as $ZrB_2$, $HfB_2$, $TiB_2$, and $LaB_6$, a carbide such as ZrC, HfC, TiC, and TaC, and a nitride such as ZrN, HfN, TiN, and TaN. Among these compounds having high melting points, a prescribed amount of a finely powdered compound suitably usable for the silica container, having particle diameter in the range from about 0.1 to about 10 μm, is selected and mixed into the powdered silica.

It is preferable that concentration of an OH group contained in the first powdered raw material 11 be in the range from about 10 to about 1000 ppm by weight.

The amount of an OH group contained in the first powdered raw material 11 may be as it is contained in the natural silica stone; or alternatively the amount of water to be added in the intermediate step can be controlled by gas atmosphere, treatment temperature, and time, in a step of drying followed thereafter. A silica glass synthesized by the flame hydrolysis method or the flame Vernueuil method contains an OH group in the range from 200 to 2000 ppm by weight; and thus concentration of an OH group can also be controlled by adding the OH-containing amorphous powdered silica obtained by these methods.

Then, the powder mixture 31 is fed into an outer frame having a rotational symmetry for molding, as shown in FIG. 1, (3) (Step 3).

Figure 3:
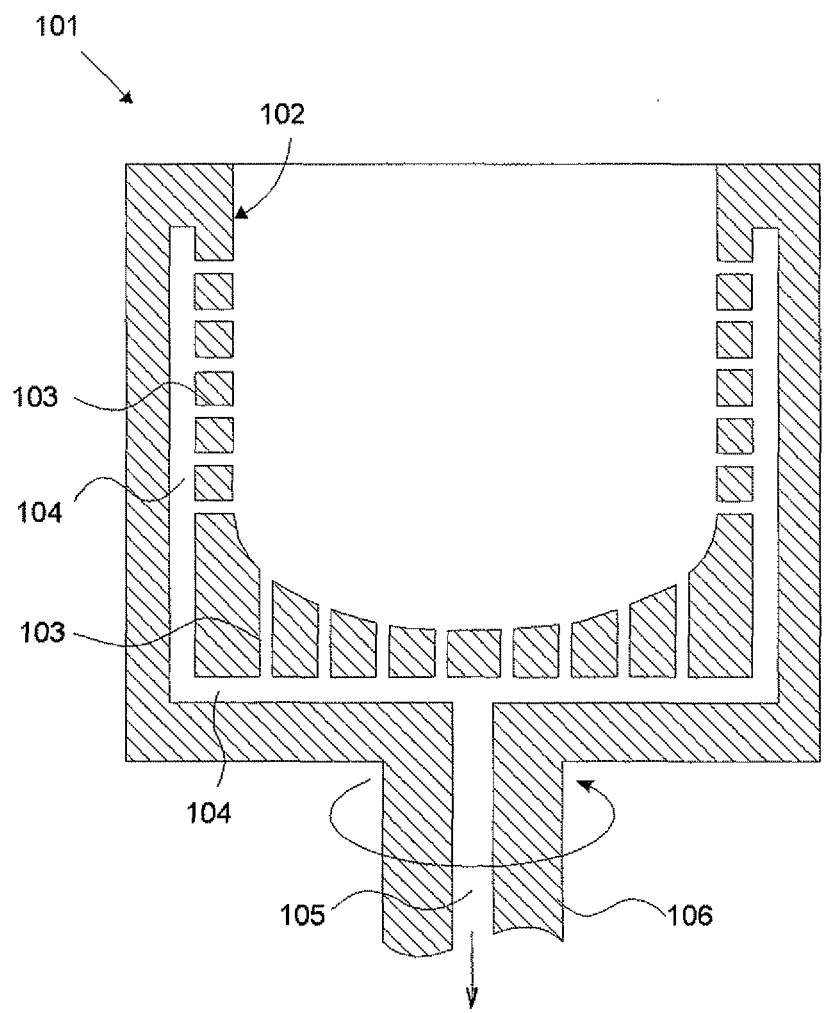
FIG. 3 is a schematic cross section view of one example of the outer frame usable in the method for producing a silica container in the present invention.

In FIG. 3, a schematic cross section view of an outer frame for preliminary molding of the powder mixture 31 is shown. The outer frame 101 is made of heat-resistant ceramics such as graphite and has a rotational symmetry. In the inner wall 102 of the outer frame 101, the aspiration holes 103 are arranged splittingly. The aspiration holes 103 are connected to the aspiration path 104. The rotation axis 106 to rotate the outer frame 101 is also arranged with the aspiration path 105, through which aspiration can be done.

Figure 4:
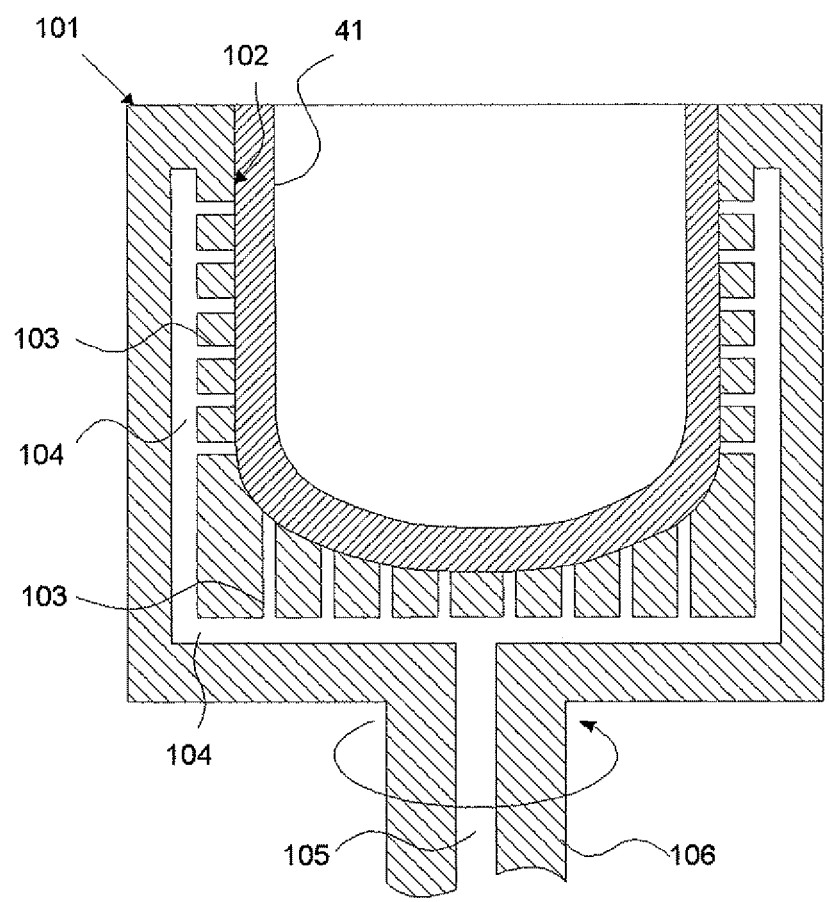
FIG. 4 is a schematic cross section view schematically showing one example of the process step of forming the preliminarily molded article in the method for producing a silica container in the present invention.

The powder mixture 31 is fed into the inner wall 102 of the outer frame 101 to preliminarily mold the powder mixture 31 to a prescribed shape in accordance with the inner wall 102 of the outer frame 101 thereby giving the preliminarily molded article 41 (refer to FIG. 2(a) and FIG. 4).

Specifically, the powder mixture 31 is fed gradually into the inner wall 102 of the outer frame 101 from a powdered raw material hopper (not shown) while rotating the outer frame 101 thereby molding to a shape of container by utilizing the centrifugal force. Alternatively, thickness of the powders to be molded to the container may be controlled to the prescribed value by contacting a plate-like inner frame (not shown) to the rotating powders from inside.

A feeding method of the powder mixture 31 into the outer frame 101 is not particularly limited; for example, a hopper equipped with an agitation screw and a measuring feeder may be used. In this case, the powder mixture 31 filled in the hopper is fed with agitating by the agitation screw while controlling the feeding amount by the measuring feeder.

Figure 5:
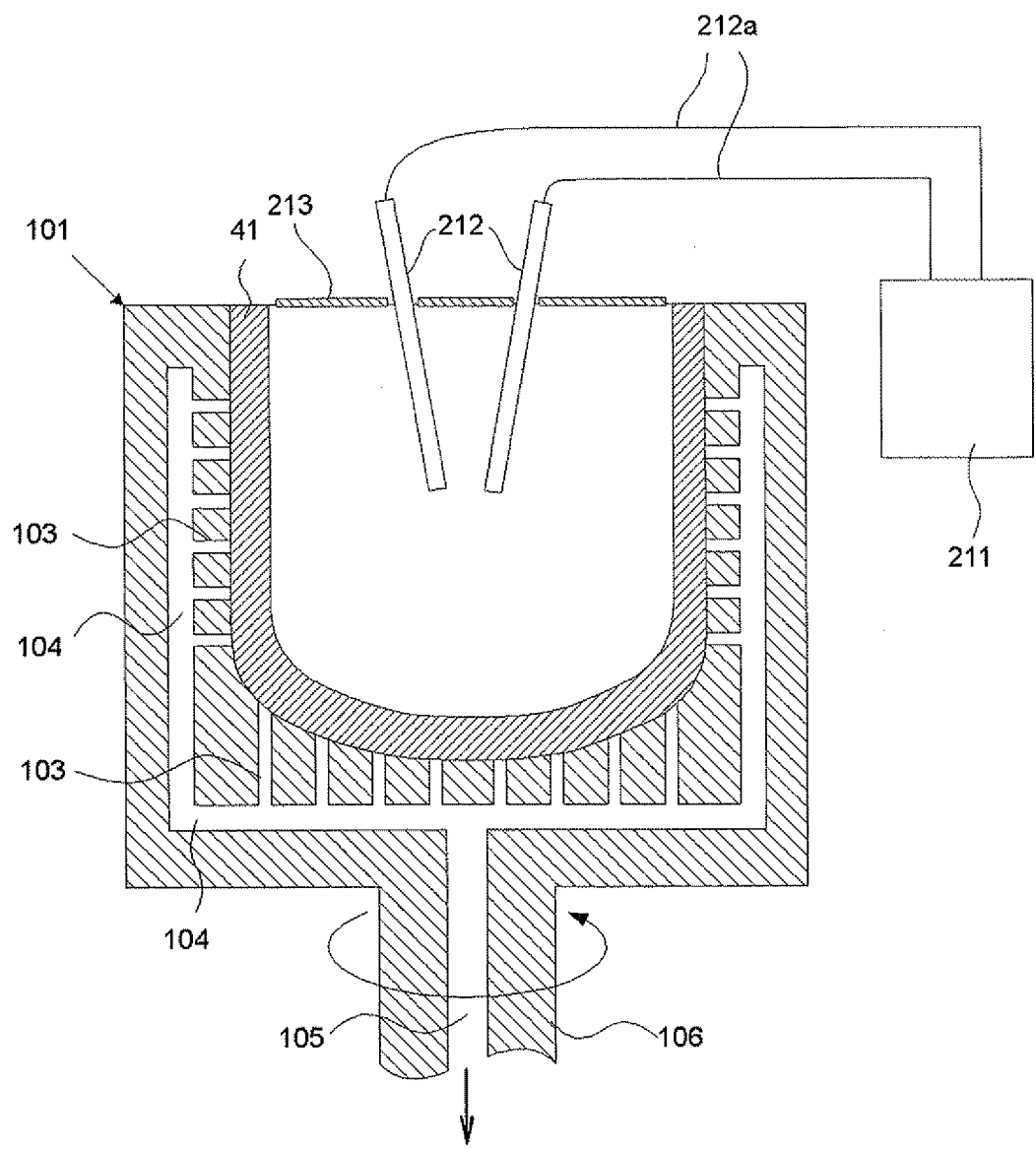
FIG. 5 is a schematic cross section view schematically showing a part of one example of the process step of forming the silica substrate in the method for producing a silica container in the present invention (before discharge-heat melting).
Figure 6:
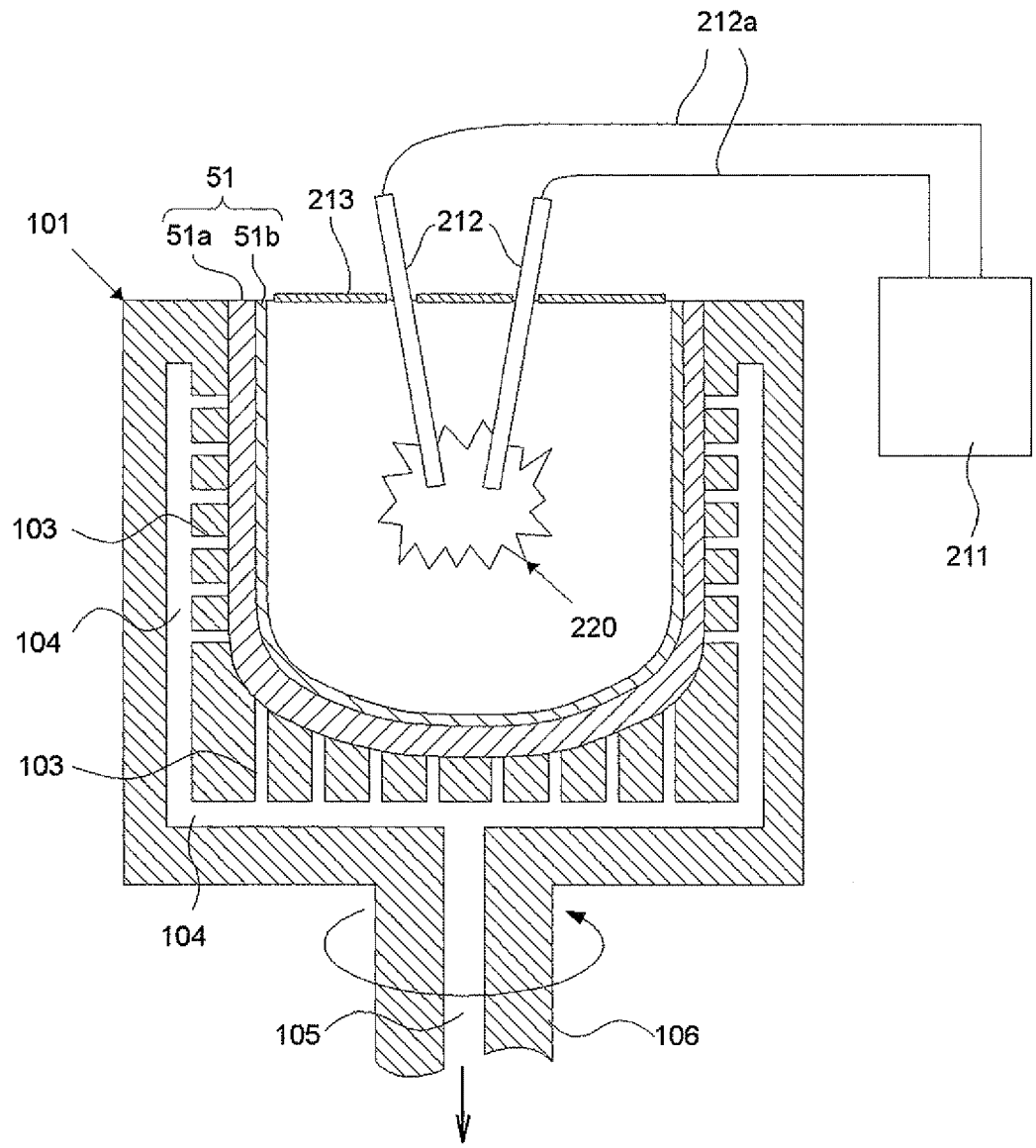
FIG. 6 is a schematic cross section view schematically showing a part of one example of the process step of forming the silica substrate in the method for producing a silica container in the present invention (during discharge-heat melting).

Then, as shown in FIG. 1, (4), the silica substrate is formed by the discharge-heating under aspiration (Step 4). Specifically, as shown in FIG. 5 and FIG. 6, the preliminarily molded article 41 is degassed by aspiration from the peripheral side through the aspiration holes 103 formed in the outer frame 101, while simultaneously heating from inside of the preliminarily molded article 41 at high temperature by the discharge-heat melting method, thereby making the silica substrate 51 have a sintered peripheral part and a fused glass inner part of the preliminarily molded article 41.

The equipment for forming the silica substrate 51 and the transparent silica glass layer 56 on the inner surface thereof is comprised of, in addition to the rotatable outer frame 101 having a revolution axis symmetry, a rotation motor (not shown), the carbon electrodes 212 which are the heat source of the discharge melting (arc melting), the electric wirings 212a, the high voltage electricity source unit 211, and the cap 213.

Procedures for melting and sintering of the preliminarily molded article 41 are as following: firstly, a vacuum pump (not shown) for degassing is started to aspirate the preliminarily molded article 41 from its outside through the aspiration holes 103 and the aspiration paths 104 and 105 and at the same time the electric charge to the carbon electrodes 212 is started, while the outer frame 101 containing the preliminarily molded article 41 is rotated at a constant rotation speed.

When the arc discharge is started (shown by numeral code 220) between the carbon electrodes 212, temperature of the inner surface part of the preliminarily molded article 41 reaches melting region of the powdered silica (estimated temperature in the range from about 1800 to about 2000° C.) thereby starting to melt the preliminarily molded article 41 from the most surface layer part. When the most surface layer part is melted, degree of vacuum by the vacuum pump for degassing increases (pressure is lowered rapidly), the layer of a melted silica glass progresses from inside to outside while dissolved gases contained in the first powdered raw material 11 are being degassed.

Heating by the electric charge and aspiration by the vacuum pump are continued (refer to FIG. 2(b)) until about half of inside the entire silica substrate thickness is melted thereby forming the transparent to semitransparent layer part 51b (transparent layer part), while about half of outside remained becomes the sintered white opaque silica part 51a (opaque layer part). Degree of vacuum is preferably $10^3$ Pa or less.

The atmospheric gas inside the silica substrate at the time of the arc melting is preferably an inert gas such as nitrogen ($N_2$), argon (Ar), and helium (He) as its main component in order to make consumption of the carbon electrodes 212 small. At this time, it is preferable that 1% or more by volume of a hydrogen gas ($H_2$) be contained so that dissolved gases in the silica glass after melting may be made small. As the reason for this, it is assumed that, for example, an oxygen gas ($O_2$), which is difficult to be degassed, reacts with hydrogen to form water ($H_2O$), which is easily released outside the silica substrate because a water molecule has larger diffusion coefficient as compared with an oxygen molecule. In addition, $H_2$ contained in the atmosphere has an effect to reduce an $H_2O$ gas, which is easily contained in an excessively large amount among the dissolved gases in the substrate.

Figure 2:
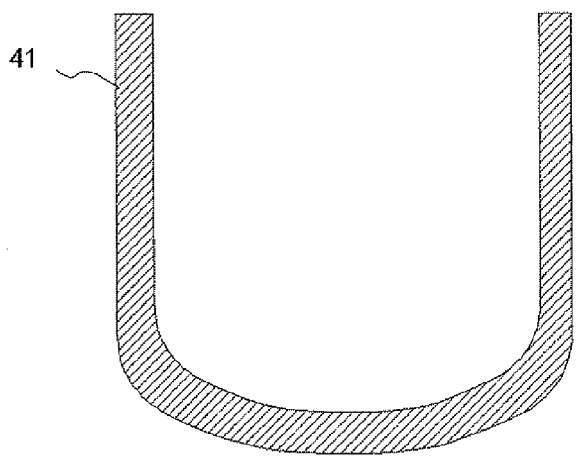
FIG. 2 are schematic cross section views of one example of the container in each process step in the method for producing a silica container in the present invention.
Figure 2:
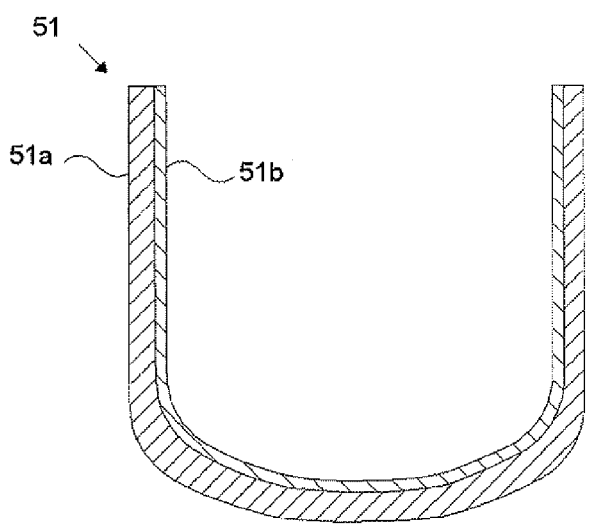
Figure 2:
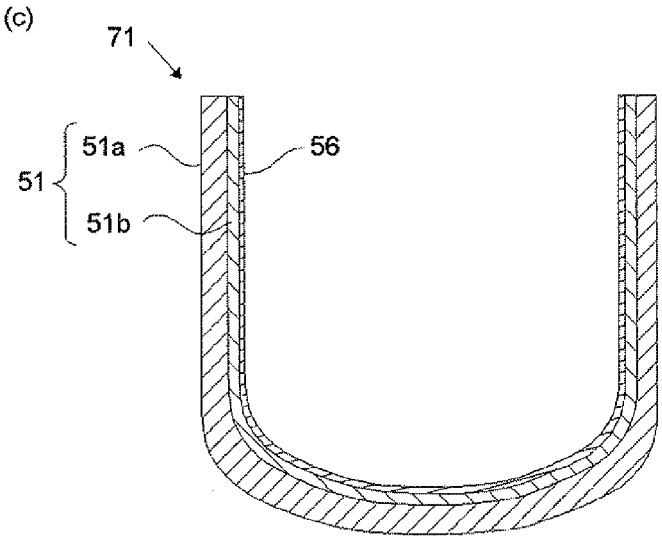

Then, as shown in FIG. 1, (5), the silica substrate 51 is heated from its inside at high temperature by the discharge-heat melting method while the second powdered raw material 21 comprised of a crystalline silica and having a higher silica purity than the first powdered raw material 11 is spread from inside the silica substrate 51, thereby forming the transparent silica glass layer 56 on inner surface of the silica substrate 51 (refer to FIG. 2 (c)) (Step 5).

A basic forming method is according to, for example, the contents described in Patent Document 6 and Patent Document 7.

Explanation will be given with referring to FIG. 7.

The equipment to form the transparent silica glass layer 56 on the inner surface of the silica substrate 51 is comprised of, in similar to the foregoing step, the rotatable outer frame 101 arranged with the silica substrate 51 having a revolution axis symmetry, a rotation motor (not shown), the hopper 303 for the second powdered raw material 21 for forming the transparent silica glass layer 56, the agitation screw 304, the measuring feeder 305, the carbon electrodes 212 which are the heat source of the discharge melting (arc melting), the electric wirings 212a, the high voltage electricity source unit 211, and the cap 213.

The transparent silica glass layer 56 is formed as follows: firstly, the outer frame 101 is set at the prescribed rotation speed, and then high voltage is loaded gradually from the high voltage electricity source unit 211 and at the same time the second powdered raw material 21 (high purity powdered silica) for formation of the transparent silica glass layer 56 is spread gradually from top of the silica substrate 51 through the raw material hopper 303. At this time, the electric discharge is started between the carbon electrodes 212 so that inside the silica substrate 51 is in the temperature range of melting of the powdered silica (estimated temperature ranging from about 1800 to about 2000° C.); and with this, the spread second powdered raw material 21 becomes to melted silica particles thereby attaching to the inner surface of the silica substrate 51. A mechanism is employed such that the carbon electrodes 212 arranged in the upper opening site of the silica substrate 51, a feeding port of the powdered raw material, and the cap 213 may change their positions relative to the silica substrate 51 to a certain degree; and by changing these positions, the transparent silica glass layer 56 can be formed on the entire inner surface of the silica substrate 51 with a uniform thickness.

The atmospheric gas inside the silica substrate 51 at the time of the arc-discharge melting to form the transparent silica glass layer is an inert gas such as a nitrogen gas ($N_2$), an argon gas (Ar), and a helium gas (He) as its main component in order to make consumption of the carbon electrodes small, while the transparent silica glass layer 56 with less amount of gaseous bubbles can be obtained by making the gas atmosphere mixed with a hydrogen gas ($H_2$) in the range from 1 to 10% by volume. When the amount of $H_2$ in the gas mixture is 1% or more by volume, reducing effect of the gaseous bubbles contained in the transparent silica glass layer can be made more prominent; on the other hand, when the amount of $H_2$ in the gas mixture is 10% or less by volume, a sufficient reducing effect of the gaseous bubbles contained in the transparent silica glass layer can be obtained and the cost of the gas mixture can be suppressed; and thus such method is desirable also from an industrial view point.

In this case, amount of dissolved $H_2O$ molecules can be effectively reduced by making the atmospheric gas dry without containing moisture.

Similarly, when the atmosphere is made to a gas mixture of an inert gas such as a nitrogen gas ($N_2$), an argon gas (Ar), or a helium gas (He), as its main component, with an oxygen gas ($O_2$) in the range from 1 to 25% by volume, fine particles of carbon (C) generated upon the arc-discharge melting is oxidized to CO and $CO_2$, thereby enabling to obtain the transparent silica glass layer 56 containing less amount of fine particles of carbon (C). When the amount of $O_2$ in the gas mixture is 1% or more by volume, reducing effect of carbon fine particles contained in the transparent silica glass layer can be made larger; when the amount of $O_2$ in the gas mixture is 25% or less by volume, sufficient reducing effect of carbon fine particles contained in the transparent silica glass layer can be obtained and consumption of the carbon electrodes can be lowered at the same time; and thus such method is desirable also from an industrial view point. In this case, CO and $CO_2$ are generated as mentioned above, but they can be removed because of aspiration.

If carbon fine particles generated by the arc-discharge melting, and carbon monoxide (CO) and carbon dioxide ($CO_2$), which are the compounds between carbon and oxygen, are remained in the transparent silica glass layer, they are regenerated as the impurities at the time of pulling up of a silicon single crystal, thereby becoming one cause of decreasing quality of the silicon. In order to suppress this further, it is preferable that inside the silica container is appropriately ventilated during melting with introducing an atmospheric gas at a certain constant rate and exhausting it at a certain constant rate.

As mentioned above, the second powdered raw material 21 can be a powdered silica after high-purification treatment or a powdered silica containing other specific element with the prescribed concentration, depending on use of the silica container finally produced. For example, if an alkaline earth metal element, i.e., calcium (Ca), strontium (Sr), or barium (Ba), is contained in the powdered raw material as the anti-etching agent, the transparent silica glass layer containing such element is resulted. When the silica composite is used as the container in the temperature range from 1300 to 1600° C., the transparent silica glass layer is recrystallized to form a cristobalite layer thereby preventing diffusion contamination of impure metal elements contained in the silica substrate 51 to a material to be treated in the container and enabling to reduce etching and dissolution of a silica glass on the transparent silica glass layer surface.

In the way as mentioned above, the silica container 71 of the present invention can be obtained, while the silica container is cleaned as following when it is necessary.

[Cleaning and Drying of the Silica Container]

For example, the silica container is etched on its surface by an aqueous solution of hydrogen fluoride (HF) in the concentration range from about 1 to about 10% with the time for 5 to 30 minutes, cleaned by pure water, and then dried in a clean air.

[Formation of a Coating Layer]

Further in the present invention, a step of applying a solution containing at least one element of calcium (Ca), strontium (Sr), or barium (Ba) onto an inner surface of the transparent silica glass layer 56 can be arranged.

Onto an inner surface of the inner surface part (namely the transparent silica glass layer 56) of the produced silica container 71 is coated at least one element of Ca, Sr, and Ba as the crystallization facilitating agent. An aqueous solution or an alcoholic solution of a nitrate salt, a chloride, and a carbonate salt of these Ca, Sr, and Ba is prepared; and it is applied onto inner surface of the transparent silica glass layer 56 and then dried. It is preferable that the total element concentration of Ca, Sr, and Ba contained therein be in the range from 5 to 500 $\mu g/cm^2$.

There is a case that this treatment is not executed depending on use of the silica container.

By executing the foregoing steps, the silica container 71 of the present invention as mentioned above and shown in FIG. 2 can be produced.

EXAMPLE

Hereinafter, the present invention will be explained more specifically by showing Examples and Comparative Examples of the present invention; but the present invention is not limited to them.

Example 1

According to the method for producing a silica container of the present invention as shown in FIG. 1, the silica container is produced as following.

Firstly, the first powdered raw material 11 was prepared as following (a part of Step 1).

A natural silica stone (100 kg) was prepared, heated in an air atmosphere at 1000° C. for 10 hours, poured into a pool of pure water, and then cooled quickly. After drying, the stone was crushed by a crusher to make total weight 90 kg of the powdered silica (the powdered natural silica stone) having particle diameter in the range from 30 to 600 μm and silica purity ($SiO_2$) of 99.999% by weight.

As the additive 12 to be added to the first powdered raw material 11, an aqueous aluminum nitrate solution was prepared (a part of Step 1). This was mixed with the first powdered raw material 11 and dried to make the powder mixture 31 (Step 2). Concentration of Al in the first powdered raw material 11 was set so as to be 50 ppm by weight.

Then, as shown in FIG. 4, the powder mixture 31 was fed to the inner wall 102 of the rotating outer frame 101 with a column-like shape made of carbon, having the aspiration holes 103 formed in the inner wall 102; a shape of the powder mixture 31 was adjusted so as to obtain uniform thickness in accordance with the shape of the outer frame 101; in this way, the preliminarily molded article 41 was made (Step 3).

Then, as shown in FIG. 5 and FIG. 6, the silica substrate 51 was formed by the discharge melting (arc melting) under aspiration (Step 4).

Specifically, the preliminarily molded article 41 was degassed by aspiration from the peripheral side through the aspiration holes 103 formed in the outer frame 101, while simultaneously heating from inside of the preliminarily molded article 41 at high temperature by the discharge-heat melting method, thereby making the silica substrate 51 having a sintered peripheral part and a fused glass inner part of the preliminarily molded article 41. Here, the atmospheric gas of 100% by volume of a nitrogen gas was used.

Figure 7:
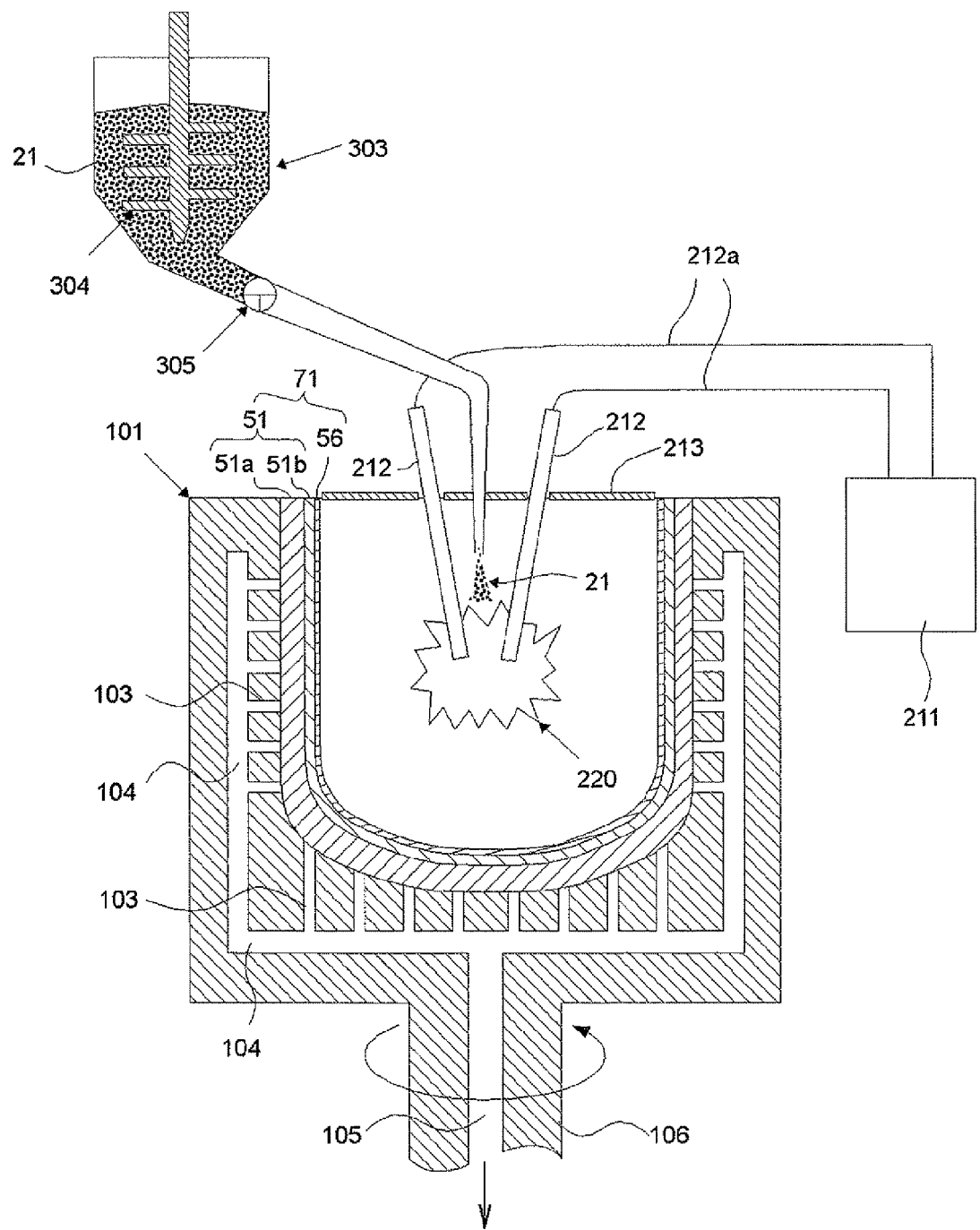
FIG. 7 is a schematic cross section view schematically showing one example of the process step of forming the transparent glass layer in the method for producing a silica container in the present invention.

Then, as shown in FIG. 7, the transparent silica glass layer 56 was formed by the discharge melting (arc melting) (Step 5).

The carbon electrodes 212 were inserted inside the silica substrate 51 in the outer frame 101, and the feeding port of the raw material for forming the transparent silica glass layer and the cap 213 were arranged. Thereafter, a powdered natural quartz (particle diameter in the range from 30 to 300 μm, silica purity of 99.9999%) as the second powdered raw material 21 was fed gradually with the discharge-heating (electric arc heating) by the carbon electrodes 212 while the outer frame 101 was rotating. A nitrogen gas containing 10% by volume of an oxygen gas (90% by volume of the nitrogen gas concentration) was used as the atmospheric gas.

The silica container 71 thus obtained was cleaned with 3% by weight of an aqueous solution of hydrogen fluoride (HF) for 3 minutes, rinsed with pure water, and then dried.

Example 2

The same procedures as Example 1 were followed except that the atmospheric gas was changed to a nitrogen gas containing 3% by volume of a hydrogen gas (97% by volume of the nitrogen gas concentration) in the step of forming the silica substrate 51 from the preliminarily molded article 41 (Step 4) and the second powdered raw material 21 was changed to a powdered synthetic cristobalite.

Example 3

The same procedures as Example 1 were followed except that the added amount of aluminum nitrate into the first powdered raw material 11 was changed to 100 ppm by weight as the Al concentration, the atmospheric gas in the step of forming the silica substrate 51 from the preliminarily molded article 41 (Step 4) was changed to a nitrogen gas containing 10% by volume of a hydrogen gas (90% by volume of the nitrogen gas concentration), and the particle diameter of the second powdered raw material 21 was changed to in the range from 50 to 300 μm.

Example 4

The same procedures as Example 3 were followed except that the additive 12 to be added into the first powdered raw material 11 was changed to aluminum oxide, the Al concentration in the first powdered raw material 11 was made to 200 ppm by weight, and a powdered synthetic cristobalite was used as the second powdered raw material 21.

Example 5

Basically the same procedures as Example 1 were followed to produce the silica container 71 except for the following changes.

As the first powdered raw material 11, a powdered natural quartz (particle diameter in the range from 30 to 900 μm) with the $SiO_2$ purity of 99.99% by weight (a good with ordinary purity) was used. As the additive 12 to be added into the first powdered raw material 11, in addition to the Al compound (Al concentration of 100 ppm by weight), zirconium oxide was added as the crystal nucleating agent so as to be contained 100 ppm by weight. A powdered synthetic cristobalite (particle diameter in the range from 50 to 300 μm) was used as the second powdered raw material 21, and was added by barium chloride so as to be contained 250 ppm by weight as barium.

The atmospheric gas in Step 4 was made to a nitrogen gas containing 5% by volume of a hydrogen gas (95% by volume of the nitrogen gas concentration), and the atmospheric gas in Step 5 was made to a nitrogen gas containing 5% by volume of an oxygen gas (95% by volume of the nitrogen gas concentration).

Example 6

The same procedures as Example 5 were followed except that a powdered synthetic cristobalite (particle diameter in the range from 100 to 300 μm) was used as the second powdered raw material 21, magnesium oxide was added so as to be contained 100 ppm by weight in place of zirconium oxide as the crystal nucleating agent, and a barium chloride solution was added to the second powdered raw material 21 in place of barium chloride and the resulting mixture was applied to inner surface of the transparent silica glass layer 56 so as to be 70 μg/cm² of the final barium concentration contained therein to obtain the silica container 71.

Example 7

The same procedures as Example 3 were followed except that the additive 12 to be added into the first powdered raw material 11 was changed to aluminum oxide with the Al concentration in the first powdered raw material 11 being 200 ppm by weight, barium chloride was added to the second powdered raw material 21 so as to be contained 300 ppm by weight as barium, and the atmospheric gas in Step 5 was changed to a nitrogen gas containing 1% by volume of a hydrogen gas (99% by volume of the nitrogen gas concentration).

Example 8

The same procedures as Example 7 were followed except that the atmospheric gas in Step 5 was changed to a nitrogen gas containing 10% by volume of a hydrogen gas (90% by volume of the nitrogen gas concentration).

Comparative Example 1

According to mostly a conventional method, a silica container (silica crucible) was prepared. Namely, a part corresponding to the silica substrate of the silica container of the present invention was formed with the discharge-melting (arc melting) by also using a high purity powdered raw material.

Firstly, a high purity powdered natural quartz having silica purity of 99.9999% or higher by weight (particle diameter in the range from 100 to 300 µm) was prepared as the equivalent for the first powdered raw material.

By using this powdered raw material, under air atmosphere this high purity powdered natural quartz was directly fed inside a rotating frame made of carbon by utilizing a centrifugal force to form a powdered quartz layer in the rotating frame, which was then discharge-melted by the carbon electrodes to form an outer layer part (corresponding to the silica substrate 51 of the present invention). Time of this procedure was 60 minutes, and temperature of the outer layer part was estimated to be about 2000° C.

Then, a high purity powdered synthetic cristobalite (particle diameter in the range from 100 to 300 µm) with the silica purity of 99.9999% or higher by weight was prepared as the powdered raw material corresponding to the second powdered raw material; and this high purity powdered synthetic cristobalite was spread from the hopper onto the inner surface of the outer layer part, and then the inner layer part (corresponding to the transparent silica glass layer 56 in the silica container 71 of the present invention) was formed by the discharge-melting.

Comparative Example 2

The same procedures as Comparative Example 1 were followed to obtain the silica container except that Ba with the concentration of 300 ppm by weight was contained in the second powdered raw material.

[Evaluation methods in Examples and Comparative Examples]

Measurements of physical properties and property evaluation of the silica container produced by each Example and Comparative Example were carried out as shown below.

[Analysis of the Impure Metal Element Concentration]

When the impure metal element concentration is relatively low (i.e., high purity), ICP-AES (Inductively Coupled Plasma-Atomic Emission Spectroscopy) or ICP-MS (Inductively Coupled Plasma-Mass Spectroscopy) was used, and when the impure metal element concentration is relatively high (i.e., low purity), AAS (Atomic Absorption Spectroscopy) was used.

[Bulk Density]

Bulk density was measured with an Archimedes method by using a water pool and a precision weighing machine.

[Method for Measuring Particle Diameter of Each Powdered Raw Material]

Two-dimensional shape observation and area measurement of each powdered raw material were carried out with an optical microscope or an electron microscope. Then the diameter was obtained by calculation of the obtained area value with the assumption that shape of the particle is a true circle. This technique was repeated statistically to obtain the range of particle diameter (99% or more by weight of particles are included in this range).

[Thickness Measurement of Each Layer]

The container cross section at the half part of total height of side wall of the silica container was measured by a scale to obtain thickness of the silica substrate and the transparent silica glass layer.

[Measurement of Concentration of an OH Group]

The measurement was done with an infrared absorption spectroscopy. Conversion to concentration of an OH group was done according to the following literature:

Dodd, D. M. and Fraser, D. B., (1966), "Optical determination of OH in fused silica", Journal of Applied Physics, vol. 37, p. 3911.

[Method for Measurement of Amount of Gas Molecules Released from Each of the Silica Substrates and the Transparent Silica Glass Layers]

Each measurement sample having the size of 10×50 mm with 1 mm thickness and mirror-polished on the both sides was prepared from the part near to inside the silica substrate (a transparent layer part not having gaseous bubbles) and the transparent silica glass layer of each of the silica containers in Examples and Comparative Examples, and then the sample thus obtained was arranged in a vacuum chamber; amount of the released gas by heating at 1000° C. under vacuum was then measured. When amount of the released gas was small, a plurality of measurement samples was simultaneously put inside the sample chamber of the gas measurement instrument to improve the sensitivity of gas detection. Details were followed according to the following literature:

Nasu, S., et al., (1990), "Gas release of various kinds of vitreous silica", Journal of Illuminating Engineering Institute of Japan, vol. 74, No. 9, pp 595 to 600.

It was confirmed that, as to the $H_2$ gas, the same value could also be obtained as the dissolved concentration in silica glass by the measurement method in the following literature.

V. S. Khotimchenko, et al., (1987), "Determining the content of hydrogen dissolved in quartz glass using the methods of Raman scattering and mass spectrometry", Journal of Applied Spectroscopy, Vol. 46, No. 6, pp 632-635.

[Evaluation of Continuous Pulling Up of a Silicon Single Crystal (Multipulling)]

A metal polysilicon with purity of 99.99999% by weight was fed into a produced silica container; thereafter, the temperature was raised to form a silicon melt, and then pulling up of a silicon single crystal was repeated for three times (multipulling). The evaluation was made as the success rate of single crystal growth. The pulling up conditions are: atmosphere of 100% of an argon gas (Ar) with the pressure inside the CZ equipment being $10^3$ Pa, 0.5 mm/minute of the pulling up rate, size of the silicon single crystal with 100 mm in diameter and 200 mm in length. Operation time for one batch was set at about 20 hours. Classification of evaluation based on the success rate of single crystal growth for repetition of three times was made as following:

| | |
|---|---|
| three times: | good |
| two times: | fair |
| one time: | poor |

[Prevention Effect of Impurity Diffusion in a Transparent Silica Glass Layer of a Silica Container]

A produced silica container was set in an electric furnace having a high purity alumina board as a heat-resistant material and molybdenum disilicate as a heater; and then heat-treatment was carried out under an air atmosphere at 1450° C. for 12 hours. Then, thickness of 100 μm of inner surface part of the container was etched for dissolution by an aqueous solution of 50% hydrogen fluoride (HF); the evaluation was made on whether diffusion of an impure metal element to a transparent silica glass layer from a silica substrate with a low silica purity was large or small by analyzing the value of alkaline metal element concentration in the etching solution.

Classification based on the total concentration value of Li, Na, and K in the portion of 100 μm thickness of the inner surface was made as following:

| | |
|---|---|
| less than 0.1 ppm by weight: | good |
| 0.1 or more ppm by weight to less than 1 ppm by weight: | fair |
| more than 1 ppm by weight: | poor |

[Crystallization Effect of Inner Surface of a Silica Container]

A produced silica container was set in an electric furnace having a high purity alumina board as a heat-resistant material and molybdenum disilicate as a heater; and then heat-treatment was carried out under an air atmosphere at 1450° C. for 12 hours. Then, an opacified part by whitening (cristobalite crystal) of inner surface of the silica container was visually checked to evaluate the recrystallization effect. Classification of evaluation on the recrystallization effect was made as following:

| | |
|---|---|
| 80% or more of total inner surface area was opacified by whitening: | good |
| 50% or more to less than 80% of total inner surface area was opacified by whitening: | fair |
| less than 50% of total inner surface area was opacified by whitening: | poor |

[Evaluation of Heat-Distortion Resistance of a Silica Container]

In the multipulling of a silicon single crystal as mentioned above, amount of collapse of the side wall upper part of a silica container toward inside thereof after the third pulling up was evaluated as following:

| | |
|---|---|
| amount of collapse toward inside was less than 1 cm: | good |
| amount of collapse toward inside was 1 cm or more and less than 2 cm: | fair |
| amount of collapse toward inside was 2 cm or more: | poor |

[Evaluation of (Relative) Production Cost of a Silica Container]

The production cost of the silica container was evaluated. In particular, costs of silica raw materials, a frame and molding, sintering of a preliminarily molded silica article, a melting energy, and the like were summed up for the relative evaluation.

| | |
|---|---|
| low cost (less than 50% relative to cost of a conventional method): | good |
| moderate cost (90 to 50% relative to cost of a conventional method): | fair |
| high cost (cost of a conventional method was taken as 100%): | poor |

Production conditions, measured physical properties, and evaluation results of each silica container produced in Examples 1 to 8 and Comparative Examples 1 and 2 are summarized in the following Tables 1 to 5 and Tables 6 to 8. Analysis data of amounts of the released gases from the silica substrate 51 are shown in Table 6; analysis data of amounts of the released gases from the transparent silica glass layer 56 are shown in Table 7; and analysis data of impurity amounts in the transparent silica glass layer 56 are shown in Table 8.

TABLE 1

| Example No. | | Example 1 | Example 2 |
|---|---|---|---|
| First powdered raw material | | Powdered natural silica<br>Particle diameter: 30 to 600 μm<br>Silica purity: 99.999% by weight | Powdered natural silica<br>Particle diameter: 30 to 600 μm<br>Silica purity: 99.999% by weight |
| Additive to the first powdered raw material | | Aluminum nitrate | Aluminum nitrate |
| Second powdered raw material | | Powdered natural silica<br>Particle diameter: 30 to 300 μm<br>Silica purity: 99.9999% by weight | Powdered synthetic cristobalite<br>Particle diameter: 30 to 300 μm<br>Silica purity: 99.9999% by weight |
| Additive to the second powdered raw material | | no | no |
| Heating method | | Substrate under aspiration<br>Discharge-heat melting | Substrate under aspiration<br>Discharge-heat melting |
| Atmospheric gas | During silica substrate formation | Nitrogen: 100% by volume | Nitrogen: 97% by volume<br>Hydrogen: 3% by volume |
| | During transparent silica glass layer formation | Nitrogen: 90% by volume<br>Oxygen: 10% by volume | Nitrogen: 90% by volume<br>Oxygen: 10% by volume |
| Physical properties of silica substrate | Color tone | White opaque to transparent | White opaque to transparent |
| | Thickness (mm) | 9 | 9 |
| | Bulk density (g/cm³) | 1.98 to 2.10 | 1.97 to 2.12 |
| | Amount of OH group (ppm by weight) | 20 | 20 |
| | Amount of additive (ppm by weight) | Al: 50 | Al: 50 |
| | Concentration of each Li, Na, K (ppm by weight) | Li: 2, Na: 4, K: 1 | Li: 1, Na: 3, K: 2 |
| Physical properties of transparent silica glass layer | Color tone | Colorless and transparent | Colorless and transparent |
| | Thickness (mm) | 3 | 3 |
| | Bulk density (g/cm³) | 2.20 | 2.20 |
| | Amount of OH group (ppm by weight) | 30 | 30 |
| | Amount of additive (ppm by weight) | 0 | 0 |
| | Inner surface coating layer (μg/cm²) | No layer | No layer |

TABLE 1-continued

| | Example No. | Example 1 | Example 2 |
|---|---|---|---|
| Evaluation | Continuous Pulling up of silicon single crystal | Fair | Fair |
| | Prevention of impurity diffusion | Fair | Fair |
| | Recrystallization | Poor | Poor |
| | Heat distortion resistance | Fair | Fair |
| | Production cost | Fair | Fair |

TABLE 2

| | Example No. | Example 3 | Example 4 |
|---|---|---|---|
| | First powdered raw material | Powdered natural silica Particle diameter: 30 to 600 μm Silica purity: 99.999% by weight | Powdered natural silica Particle diameter: 30 to 600 μm Silica purity: 99.999% by weight |
| | Additive to the first powdered raw material | Aluminum nitrate | Aluminum oxide |
| | Second powdered raw material | Powdered natural silica Particle diameter: 50 to 300 μm Silica purity: 99.9999% by weight | Powdered synthetic cristobalite Particle diameter: 50 to 300 μm Silica purity: 99.9999% by weight |
| | Additive to the second powdered raw material | no | no |
| | Heating method | Substrate is aspirated Discharge-heat melting | Substrate under aspiration Discharge-heat melting |
| Atmospheric gas | During silica substrate formation | Nitrogen: 90% by volume Hydrogen: 10% by volume | Nitrogen: 90% by volume Hydrogen: 10% by volume |
| | During transparent silica glass layer formation | Nitrogen: 90% by volume Oxygen: 10% by volume | Nitrogen: 90% by volume Oxygen: 10% by volume |
| Physical properties of silica substrate | Color tone | White opaque to transparent | White opaque to transparent |
| | Thickness (mm) | 9 | 9 |
| | Bulk density (g/cm$^3$) | 1.95 to 2.10 | 1.95 to 2.11 |
| | Amount of OH group (ppm by weight) | 30 | 30 |
| | Amount of additive (ppm by weight) | Al: 100 | Al: 200 |
| | Concentration of each Li, Na, K (ppm by weight) | Li: 1, Na: 3, K: 1 | Li: 1, Na: 3, K: 2 |
| Physical properties of transparent silica glass layer | Color tone | Colorless and transparent | Colorless and transparent |
| | Thickness (mm) | 3 | 3 |
| | Bulk density (g/cm$^3$) | 2.20 | 2.20 |
| | Amount of OH group (ppm by weight) | 50 | 50 |
| | Amount of additive (ppm by weight) | 0 | 0 |
| | Inner surface coating layer (μg/cm$^2$) | No layer | No layer |

TABLE 2-continued

| | Example No. | Example 3 | Example 4 |
|---|---|---|---|
| Evaluation | Continuous Pulling up of silicon single crystal | Good | Good |
| | Prevention of impurity diffusion | Good | Good |
| | Recrystallization | Poor | Poor |
| | Heat distortion resistance | Fair | Good |
| | Production cost | Fair | Fair |

TABLE 3

| | Example No. | Example 5 | Example 6 |
|---|---|---|---|
| | First powdered raw material | Powdered natural silica Particle diameter: 30 to 900 μm Silica purity: 99.99% by weight | Powdered natural silica Particle diameter: 30 to 900 μm Silica purity: 99.99% by weight |
| | Additive to the first powdered raw material | Aluminum nitrate Zirconium oxide | Aluminum nitrate Magnesium oxide |
| | Second powdered raw material | Powdered synthetic cristobalite Particle diameter: 50 to 300 μm Silica purity: 99.9999% by weight | Powdered synthetic cristobalite Particle diameter: 100 to 300 μm Silica purity: 99.9999% by weight |
| | Additive to the second powdered raw material | Barium chloride | no |
| | Heating method | Substrate under aspiration Discharge-heat melting | Substrate under aspiration Discharge-heat melting |
| Atmospheric gas | During silica substrate formation | Nitrogen: 95% by volume Hydrogen: 5% by volume | Nitrogen: 95% by volume Hydrogen: 5% by volume |
| | During transparent silica glass layer formation | Nitrogen: 95% by volume Oxygen: 5% by volume | Nitrogen: 95% by volume Oxygen: 5% by volume |
| Physical properties of silica substrate | Color tone | White opaque to transparent | White opaque to transparent |
| | Thickness (mm) | 9 | 9 |
| | Bulk density (g/cm$^3$) | 1.93 to 2.15 | 1.92 to 2.13 |
| | Amount of OH group (ppm by weight) | 60 | 60 |
| | Amount of additive (ppm by weight) | Al: 100, ZrO$_2$: 100 | Al: 100, MgO: 100 |
| | Concentration of each Li, Na, K (ppm by weight) | Li: 5, Na: 50, K: 5 | Li: 10, Na: 30, K: 5 |
| Physical properties of transparent silica glass layer | Color tone | Colorless and transparent | Colorless and transparent |
| | Thickness (mm) | 3 | 3 |
| | Bulk density (g/cm$^3$) | 2.20 | 2.20 |
| | Amount of OH group (ppm by weight) | 60 | 60 |
| | Amount of additive (ppm by weight) | Ba: 250 | 0 |
| | Inner surface coating layer (μg/cm$^2$) | No layer | Ba: 70 |

TABLE 3-continued

| Example No. | | Example 5 | Example 6 |
|---|---|---|---|
| Evaluation | Continuous Pulling up of silicon single crystal | Good | Good |
| | Prevention of impurity diffusion | Fair | Fair |
| | Recrystallization | Good | Good |
| | Heat distortion resistance | Good | Good |
| | Production cost | Good | Good |

TABLE 4

| Example No. | | Example 7 | Example 8 |
|---|---|---|---|
| First powdered raw material | | Powdered natural silica<br>Particle diameter: 30 to 600 μm<br>Silica purity: 99.999% by weight | Powdered natural silica<br>Particle diameter: 30 to 600 μm<br>Silica purity: 99.999% by weight |
| Additive to the first powdered raw material | | Aluminum oxide | Aluminum oxide |
| Second powdered raw material | | Powdered natural silica<br>Particle diameter: 50 to 300 μm<br>Silica purity: 99.9999% by weight | Powdered natural silica<br>Particle diameter: 50 to 300 μm<br>Silica purity: 99.9999% by weight |
| Additive to the second powdered raw material | | Barium chloride | Barium chloride |
| Heating method | | Substrate under aspiration Discharge-heat melting | Substrate under aspiration Discharge-heat melting |
| Atmospheric gas | During silica substrate formation | Nitrogen: 90% by volume<br>Hydrogen: 10% by volume | Nitrogen: 90% by volume<br>Hydrogen: 10% by volume |
| | During transparent silica glass layer formation | Nitrogen: 99% by volume<br>Hydrogen: 1% by volume | Nitrogen: 90% by volume<br>Hydrogen: 10% by volume |
| Physical properties of silica substrate | Color tone | White opaque to transparent | White opaque to transparent |
| | Thickness (mm) | 9 | 9 |
| | Bulk density (g/cm$^3$) | 1.95 to 2.11 | 1.95 to 2.11 |
| | Amount of OH group (ppm by weight) | 30 | 30 |
| | Amount of additive (ppm by weight) | Al: 200 | Al: 200 |
| | Concentration of each Li, Na, K (ppm by weight) | Li: 1, Na: 3, K: 1 | Li: 1, Na: 3, K: 1 |
| Physical properties of transparent silica glass layer | Color tone | Colorless and transparent | Colorless and transparent |
| | Thickness (mm) | 3 | 3 |
| | Bulk density (g/cm$^3$) | 2.20 | 2.20 |
| | Amount of OH group (ppm by weight) | 30 | 25 |
| | Amount of additive (ppm by weight) | Ba: 300 | Ba: 300 |
| | Inner surface coating layer (μg/cm$^2$) | No layer | No layer |

TABLE 4-continued

| Example No. | | Example 7 | Example 8 |
|---|---|---|---|
| Evaluation | Continuous Pulling up of silicon single crystal | Good | Good |
| | Prevention of impurity diffusion | Good | Good |
| | Recrystallization | Good | Good |
| | Heat distortion resistance | Good | Good |
| | Production cost | Fair | Fair |

TABLE 5

| Example No. | | Comparative Example 1 | Comparative Example 2 |
|---|---|---|---|
| First powdered raw material | | Powdered natural silica<br>Particle diameter: 100 to 300 μm<br>Silica purity: 99.9999% by weight | Powdered natural silica<br>Particle diameter: 100 to 300 μm<br>Silica purity: 99.9999% by weight |
| Additive to the first powdered raw material | | No | No |
| Second powdered raw material | | Powdered synthetic cristobalite<br>Particle diameter: 100 to 300 μm<br>Silica purity: 99.9999% by weight | Powdered synthetic cristobalite<br>Particle diameter: 100 to 300 μm<br>Silica purity: 99.9999% by weight |
| Additive to the second powdered raw material | | no | Barium chloride |
| Heating method | | Substrate under normal pressure Discharge-heat melting | Substrate under normal pressure Discharge-heat melting |
| Atmospheric gas | During silica substrate formation | Air | Air |
| | During transparent silica glass layer formation | Moisture-containing air | Moisture-containing air |
| Physical properties of silica substrate | Color tone | White opaque | White opaque |
| | Thickness (mm) | 9 | 9 |
| | Bulk density (g/cm$^3$) | 2.05 | 2.07 |
| | Amount of OH group (ppm by weight) | 90 | 90 |
| | Amount of additive (ppm by weight) | Nature-derived Al: 1 | Nature-derived Al: 1 |
| | Concentration of each Li, Na, K (ppm by weight) | Li: <0.1, Na: <0.1, K: <0.1 | Li: <0.1, Na: <0.1, K: <0.1 |
| Physical properties of transparent silica glass layer | Color tone | Colorless and transparent | Colorless and transparent |
| | Thickness (mm) | 3 | 3 |
| | Bulk density (g/cm$^3$) | 2.20 | 2.20 |
| | Amount of OH group (ppm by weight) | 250 | 210 |
| | Amount of additive (ppm by weight) | 0 | Ba: 300 |
| | Inner surface coating layer (μg/cm$^2$) | No layer | No layer |

TABLE 5-continued

| Example No. | | Comparative Example 1 | Comparative Example 2 |
|---|---|---|---|
| Evaluation | Continuous Pulling up of silicon single crystal | Fair | Good |
| | Prevention of impurity diffusion | Good | Good |
| | Recrystallization | Poor | Good |
| | Heat distortion resistance | Poor | Fair |
| | Production cost | Poor | Poor |

TABLE 6

| Released gas amount from silica substrate | Example 1 | Example 2 | Example 3 | Example 4 | Example 5 | Example 6 | Example 7 | Example 8 | Comparative Example 1 | Comparative Example 2 |
|---|---|---|---|---|---|---|---|---|---|---|
| $O_2$ (molecules/cm$^2$) | $1 \times 10^{15}$ | $<1 \times 10^{15}$ | $<1 \times 10^{15}$ | $<1 \times 10^{15}$ | $<1 \times 10^{15}$ | $<1 \times 10^{15}$ | $<1 \times 10^{15}$ | $<1 \times 10^{15}$ | $2 \times 10^{15}$ | $2 \times 10^{15}$ |
| $H_2O$ (molecules/cm$^3$) | $1 \times 10^{17}$ | $3 \times 10^{16}$ | $2 \times 10^{16}$ | $4 \times 10^{16}$ | $8 \times 10^{16}$ | $7 \times 10^{16}$ | $2 \times 10^{16}$ | $2 \times 10^{16}$ | $6 \times 10^{17}$ | $7 \times 10^{17}$ |
| $H_2$ (molecules/cm$^3$) | $1 \times 10^{16}$ | $3 \times 10^{16}$ | $4 \times 10^{16}$ | $2 \times 10^{16}$ | $2 \times 10^{16}$ | $2 \times 10^{16}$ | $2 \times 10^{16}$ | $2 \times 10^{16}$ | $<1 \times 10^{16}$ | $<1 \times 10^{16}$ |
| CO (molecules/cm$^3$) | $<1 \times 10^{16}$ | $<1 \times 10^{16}$ | $<1 \times 10^{16}$ | $<1 \times 10^{16}$ | $2 \times 10^{16}$ | $2 \times 10^{16}$ | $<1 \times 10^{16}$ | $<1 \times 10^{16}$ | $1 \times 10^{17}$ | $2 \times 10^{17}$ |
| $CO_2$ (molecules/cm$^3$) | $<5 \times 10^{15}$ | $<5 \times 10^{15}$ | $<5 \times 10^{15}$ | $<5 \times 10^{15}$ | $6 \times 10^{15}$ | $7 \times 10^{15}$ | $<5 \times 10^{15}$ | $<5 \times 10^{15}$ | $2 \times 10^{16}$ | $3 \times 10^{16}$ |

TABLE 7

| Released gas amount from transparent silica glass layer | Example 1 | Example 2 | Example 3 | Example 4 | Example 5 | Example 6 | Example 7 | Example 8 | Comparative Example 1 | Comparative Example 2 |
|---|---|---|---|---|---|---|---|---|---|---|
| $O_2$ (molecules/cm$^2$) | $<1 \times 10^{15}$ | $<1 \times 10^{15}$ | $<1 \times 10^{15}$ | $<1 \times 10^{15}$ | $1 \times 10^{15}$ | $1 \times 10^{15}$ | $<1 \times 10^{15}$ | $<1 \times 10^{15}$ | $2 \times 10^{15}$ | $3 \times 10^{15}$ |
| $H_2O$ (molecules/cm$^3$) | $5 \times 10^{16}$ | $7 \times 10^{16}$ | $4 \times 10^{16}$ | $6 \times 10^{16}$ | $1 \times 10^{17}$ | $1 \times 10^{17}$ | $<2 \times 10^{16}$ | $<2 \times 10^{16}$ | $5 \times 10^{17}$ | $7 \times 10^{17}$ |
| $H_2$ (molecules/cm$^3$) | $<1 \times 10^{16}$ | $<1 \times 10^{16}$ | $<1 \times 10^{16}$ | $<1 \times 10^{16}$ | $<1 \times 10^{16}$ | $<1 \times 10^{16}$ | $<1 \times 10^{16}$ | $<1 \times 10^{16}$ | $1 \times 10^{16}$ | $1 \times 10^{16}$ |
| CO (molecules/cm$^3$) | $3 \times 10^{16}$ | $1 \times 10^{16}$ | $2 \times 10^{16}$ | $2 \times 10^{16}$ | $5 \times 10^{16}$ | $5 \times 10^{16}$ | $<1 \times 10^{16}$ | $<1 \times 10^{16}$ | $1 \times 10^{17}$ | $2 \times 10^{17}$ |
| $CO_2$ (molecules/cm$^3$) | $1 \times 10^{16}$ | $7 \times 10^{15}$ | $5 \times 10^{15}$ | $7 \times 10^{15}$ | $1 \times 10^{16}$ | $1 \times 10^{16}$ | $<5 \times 10^{15}$ | $<5 \times 10^{15}$ | $3 \times 10^{16}$ | $4 \times 10^{16}$ |

TABLE 8

(Unit: ppb by weight)

| Element | Example 1 | Example 2 | Example 3 | Example 4 | Example 5 | Example 6 | Example 7 | Example 8 | Comparative Example 1 | Comparative Example 2 |
|---|---|---|---|---|---|---|---|---|---|---|
| Li | 20 | 5 | 20 | 7 | 5 | 3 | 10 | 20 | 1 | 3 |
| Na | 50 | 15 | 60 | 20 | 10 | 15 | 50 | 45 | 10 | 10 |
| K | 30 | 10 | 20 | 12 | 7 | 7 | 10 | 20 | 8 | 6 |
| Ti | 25 | 5 | 25 | 5 | 6 | 7 | 20 | 25 | 5 | 5 |
| V | 3 | <1 | 2 | 1 | 2 | <1 | 1 | 1 | <1 | <1 |
| Cr | 8 | 2 | 9 | 2 | 1 | 2 | 8 | 7 | 3 | 3 |
| Mn | 3 | <1 | 4 | 1 | 1 | 1 | 2 | 3 | 2 | 1 |
| Fe | 30 | 3 | 30 | 2 | 3 | 2 | 20 | 25 | 3 | 3 |
| Co | 5 | 2 | 6 | 1 | 1 | 1 | 5 | 5 | 3 | 2 |
| Ni | 10 | 1 | 15 | 2 | 2 | 2 | 10 | 10 | 2 | 1 |
| Cu | 20 | 3 | 15 | 3 | 3 | 2 | 15 | 10 | 3 | 1 |
| Zn | 6 | 3 | 5 | 1 | 1 | 2 | 5 | 5 | 3 | <1 |

TABLE 8-continued (Unit: ppb by weight)

| Element | Example 1 | Example 2 | Example 3 | Example 4 | Example 5 | Example 6 | Example 7 | Example 8 | Comparative Example 1 | Comparative Example 2 |
|---------|-----------|-----------|-----------|-----------|-----------|-----------|-----------|-----------|-----------------------|-----------------------|
| Zr | 15 | 2 | 10 | 2 | 2 | 3 | 10 | 10 | <1 | 3 |
| Mo | 1 | 1 | 2 | 1 | 1 | 1 | 1 | 1 | <1 | <1 |
| Ta | 2 | <1 | 1 | <1 | 1 | <1 | 2 | 1 | <1 | <1 |
| W | 1 | 1 | 2 | 1 | 1 | 1 | 1 | 1 | <1 | <1 |

As can be seen in Tables 1 to 8, in Examples 1 to 8 which were in accord with the method for producing a silica container of the present invention, a silica container giving the results in pulling up of a single crystal no way inferior to a conventional silica container of Comparative Example 1 could be obtained, even though a low purity powdered silica available more cheaply and with a higher productivity as compared with Comparative Example 1 was used.

In addition, in Examples 1 to 8, the amounts of an $H_2O$ molecule (water) were extraordinary lower as compared with Comparative Examples 1 and 2, indicating that a silica container, giving less defects such as a void and a pinhole in the silicon single crystal produced by using the silica container thereof, could be produced.

It must be noted here that the present invention is not limited to the embodiments as described above. The foregoing embodiments are mere examples; any form having substantially the same composition as the technical concept described in claims of the present invention and showing similar effects is included in the technical scope of the present invention.

The invention claimed is:

1. A silica container comprised of:
a silica substrate having a rotational symmetry, a peripheral part of the silica substrate comprising a white opaque layer that contains gaseous bubbles, and
a colorless transparent silica glass layer, not substantially containing gaseous bubbles, formed on an inner wall of the silica substrate,
wherein:
the silica substrate contains:
a concentration of OH groups in a range from 10 to 1000 ppm by weight,
at least one compound selected from the group consisting of Al and crystal nucleating agents, a total concentration of Al and crystal nucleating agents present in the silica substrate being in a range of 10 to 1000 ppm per weight, and
a total element concentration of Li, Na, and K of 100 or less ppm by weight,
an amount of $H_2O$ molecules released upon heating of the silica substrate at 1000° C. under vacuum is $3\times10^{17}$ or less molecules/cm³, and
the transparent silica glass layer contains:
a concentration of OH groups in a range from 1 to 200 ppm by weight,
each of Li, Na, and K in an element concentration of 60 or less ppb by weight, and
each of Ti, V, Cr, Mn, Fe, Co, Ni, Cu, Zn, Zr, Mo, Ta, and W in an element concentration of 30 or less ppb by weight.

2. The silica container according to claim 1, wherein the crystal nucleating agents are CaO, MgO, BeO, $ZrO_2$, $HfO_2$, $Al_2O_3$, $ZrB_2$, $HfB_2$, $TiB_2$, $LaB_6$, ZrC, HfC, TiC, TaC, ZrN, HfN, TiN, and TaN.

3. The silica container according to claim 1, wherein the silica substrate contains OH groups in a concentration range from 30 to 300 ppm by weight, Al in a concentration range from 30 to 300 ppm by weight, and the crystal nucleating agents in a concentration range from 30 to 300 ppm by weight.

4. The silica container according to claim 1, wherein, upon heating of the silica substrate at 1000° C. under vacuum:
an amount of $O_2$ molecules released is $1\times10^{15}$ or less molecules/cm²,
an amount of $H_2O$ molecules released is $5\times10^{16}$ or less molecules/cm³,
an amount of $H_2$ molecules released is $5\times10^{16}$ or less molecules/cm³,
an amount of CO molecules released is $5\times10^{16}$ or less molecules/cm³, and
an amount of $CO_2$ molecules released is $1\times10^{16}$ or less molecules/cm³.

5. The silica container according to claim 1, wherein the transparent silica glass layer contains:
a concentration of OH groups in a range from 30 to 100 ppm by weight,
each of Li, Na, and K in an element concentration of 20 or less ppb by weight, and
each of Ti, V, Cr, Mn, Fe, Co, Ni, Cu, Zn, Zr, Mo, Ta, and W in an element concentration of 10 or less ppb by weight.

6. The silica container according to claim 1, wherein upon heating the transparent silica glass layer at 1000° C. under vacuum:
an amount of $O_2$ molecules released is $1\times10^{15}$ or less molecules/cm²,
an amount of $H_2O$ molecules released is $3\times10^{17}$ or less molecules/cm³,
an amount of $H_2$ molecules released is $5\times10^{16}$ or less molecules/cm³,
an amount of CO molecules released is $5\times10^{16}$ or less molecules/cm³, and
an amount of $CO_2$ molecules released is $1\times10^{16}$ or less molecules/cm³.

7. The silica container according to claim 1, wherein the transparent silica glass layer contains at least one element selected from the group consisting of Ca, Sr, and Ba, a total element concentration of Ca, Sr, and Ba present in the transparent silica glass layer being in a range from 50 to 5000 ppm by weight.

8. The silica container according to claim 1, wherein the transparent silica glass layer further comprises a coating layer on an inner surface side of the transparent silica glass layer, the coating layer containing at least one element selected from the group consisting of Ca, Sr, and Ba, a total element concentration of Ca, Sr, and Ba contained in the coating layer being in a range from 5 to 500 μg/cm².

* * * * *